United States Patent
Park

(10) Patent No.: US 12,245,460 B2
(45) Date of Patent: Mar. 4, 2025

(54) DISPLAY APPARATUS

(71) Applicant: Samsung Display Co., Ltd., Yongin-si (KR)

(72) Inventor: Okkyung Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 474 days.

(21) Appl. No.: 17/585,037

(22) Filed: Jan. 26, 2022

(65) Prior Publication Data

US 2022/0246688 A1    Aug. 4, 2022

(30) Foreign Application Priority Data

Feb. 1, 2021    (KR) .................. 10-2021-0013987

(51) Int. Cl.
  *H10K 59/121*    (2023.01)
  *H10K 59/131*    (2023.01)
  *H10K 59/65*    (2023.01)

(52) U.S. Cl.
  CPC ......... *H10K 59/121* (2023.02); *H10K 59/131* (2023.02); *H10K 59/65* (2023.02)

(58) Field of Classification Search
  CPC .... H10K 59/121; H10K 59/131; H10K 59/65; H10K 59/12; G09G 3/3225; H01L 27/124
  See application file for complete search history.

(56) References Cited

U.S. PATENT DOCUMENTS

| | | | |
|---|---|---|---|
| 9,620,577 B2 | 4/2017 | Choi et al. | |
| 10,854,690 B2 | 12/2020 | Bae et al. | |
| 2020/0258953 A1* | 8/2020 | Bae | H10K 50/858 |
| 2020/0258967 A1 | 8/2020 | Kim et al. | |
| 2020/0402465 A1* | 12/2020 | Lou | G02F 1/1333 |
| 2021/0012706 A1 | 1/2021 | Yang et al. | |

FOREIGN PATENT DOCUMENTS

| | | |
|---|---|---|
| CN | 111785761 | 10/2020 |
| KR | 10-2016-0104766 | 9/2016 |
| KR | 10-2020-0097371 | 8/2020 |
| KR | 10-2020-0099251 | 8/2020 |

\* cited by examiner

*Primary Examiner* — Kretelia Graham
*Assistant Examiner* — Jaesun Lee
(74) *Attorney, Agent, or Firm* — KILE PARK REED & HOUTTEMAN PLLC

(57) ABSTRACT

A display apparatus includes a substrate including a component area including a first auxiliary display area and a transmission area and a main display area, a first main pixel circuit disposed in the main display area, a first main conductive line disposed in the main display area and electrically connected to the first main pixel circuit, a first auxiliary pixel circuit disposed in the first auxiliary display area, a first auxiliary conductive line disposed in the first auxiliary display area and electrically connected to the first auxiliary pixel circuit, and a first connection line disposed in the component area, at least partially overlapping the transmission area, and electrically connecting the first main conductive line to the first auxiliary conductive line.

18 Claims, 19 Drawing Sheets

DISPLAY APPARATUS

CROSS-REFERENCE TO RELATED APPLICATION(S)

This application claims priority to and benefits of Korean Patent Application No. 10-2021-0013987 under 35 U.S.C. § 119, filed on Feb. 1, 2021, in the Korean Intellectual Property Office, the entire contents of which are incorporated herein by reference.

BACKGROUND

1. Technical Field

One or more embodiments relate to a display apparatus.

2. Description of the Related Art

Recently, display apparatuses have been used for various purposes. Also, display apparatuses have become thin and lightweight and thus the range of use thereof tends to extend.

As an area of a display area in a display apparatus is extended, various functions connected or linked to the display apparatus are added. As a method of extending the area of the display area and adding various functions, research into a display apparatus having an area used to add various functions, within a display area, instead of an image display, is continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus having an extended display area to display an image also in an area in which a component, which is an electronic element, is arranged or disposed.

Objects to be achieved by the disclosure are not limited to the ones mentioned above, and other objectives that are not mentioned will be clearly understood by those of ordinary skill in the art from the description of the disclosure.

Additional aspects will be set forth in part in the description which follows and, in part, will be apparent from the description, or may be learned by practice of the presented embodiments of the disclosure.

One or more embodiments include a display apparatus that may include a substrate including a component area including a first auxiliary display area and a transmission area surrounding the first auxiliary display area; and a main display area at least partially surrounding the component area; a first main pixel circuit disposed in the main display area; a first main conductive line disposed in the main display area, extending in a first direction and electrically connected to the first main pixel circuit; a first auxiliary pixel circuit disposed in the first auxiliary display area; a first auxiliary conductive line disposed in the first auxiliary display area, extending in the first direction and electrically connected to the first auxiliary pixel circuit; and a first connection line disposed in the component area, at least partially overlapping the transmission area, and electrically connecting the first main conductive line to the first auxiliary conductive line.

The component area may include a second auxiliary display area spaced apart from the first auxiliary display area and surrounded by the transmission area, and the display apparatus may include a second auxiliary pixel circuit disposed in the second auxiliary display area; a second auxiliary conductive line disposed in the second auxiliary display area, extending in the first direction and electrically connected to the second auxiliary pixel circuit; and a second connection line disposed in the component area, at least partially overlapping the transmission area, and electrically connecting the first auxiliary conductive line to the second auxiliary conductive line.

The first connection line and the second connection line may be spaced apart from each other in the first direction.

The display apparatus may further include a first contact plug of a plurality of first contact plugs, the first contact plug electrically connecting the first connection line to the first auxiliary conductive line; a second contact plug of a plurality of second contact plugs, the second contact plug electrically connecting the second connection line to the first auxiliary conductive line; and a first auxiliary display element disposed in the first auxiliary display area and electrically connected to the first auxiliary pixel circuit, wherein the first auxiliary display element overlaps the first contact plug of the plurality of first contact plugs and the second contact plug of the plurality of second contact plugs.

The first auxiliary display element may include a pixel electrode; an intermediate layer disposed on the pixel electrode; and an opposite electrode disposed on the intermediate layer, wherein the pixel electrode overlaps the first contact plug and the second contact plug.

The first connection line and the first contact plug may be integral with each other, and the second connection line and the second contact plug may be integral with each other.

The component area may include a second auxiliary display area spaced apart from the first auxiliary display area and surrounded by the transmission area, and the display apparatus may further include a second auxiliary pixel circuit disposed in the second auxiliary display area; and a second auxiliary conductive line disposed in the second auxiliary display area, extending in the first direction and electrically connected to the second auxiliary pixel circuit, the first auxiliary display area is disposed between the main display area and the second auxiliary display area, and the first connection line extends through the first auxiliary pixel circuit toward the second auxiliary pixel circuit and electrically connect the first main conductive line to the second auxiliary conductive line.

The display apparatus may further include at least one first contact plug of a plurality of first contest plugs electrically connecting the first connection line to the first auxiliary conductive line; and at least one second contact plug of a plurality of second contest plugs electrically connecting the first connection line to the second auxiliary conductive line.

The display apparatus may further include a second main pixel circuit disposed in the main display area; a second main conductive line disposed in the main display area, extending in a second direction, and electrically connected to the second main pixel circuit; a second auxiliary conductive line disposed in the first auxiliary display area, extending in the second direction and electrically connected to the first auxiliary pixel circuit; and a third connection line disposed in the component area, at least partially overlapping the transmission area, and electrically connecting the second main conductive line to the second auxiliary conductive line.

The display apparatus may further include a first conductive layer disposed on the substrate and including the first main conductive line and the first auxiliary conductive line; a second conductive layer disposed on the first conductive layer and including the second main conductive line and the second auxiliary conductive line; a third conductive layer disposed on the second conductive layer and including the first connection line; and a fourth conductive line disposed on the third conductive layer and including the third connection line.

The first connection line may have a higher light transmittance than a light transmittance of the first main conductive line and the first auxiliary conductive line.

The first connection line may include a transparent conducting oxide.

The first connection line, the first main conductive line and the first auxiliary conductive line, may be disposed on a same layer, and an end of the first connection line may overlap an end of the first main conductive line, and another end of the first connection line may overlap an end of the first auxiliary conductive line.

The display apparatus may further include a plurality of main pixel circuits including the first main pixel circuit and disposed in the main display area; a plurality of main display elements disposed in the main display area and respectively electrically connected to the plurality of main pixel circuits; a plurality of auxiliary pixel circuits including the first auxiliary pixel circuit and disposed in the component area; and a plurality of auxiliary display elements disposed in the component area and respectively electrically connected to the plurality of auxiliary pixel circuits, wherein a number of the plurality of main display elements per unit area is greater than a number of the plurality of auxiliary display elements per unit area.

The display apparatus may further include a first auxiliary display element disposed in the first auxiliary display area and electrically connected to the first auxiliary pixel circuit, the first auxiliary pixel circuit may include a first transistor controlling a current flowing to the first auxiliary display element, in response to a gate-source voltage; a second transistor that transfers a data voltage to the first transistor in response to a first scan signal; and a storage capacitor including a first electrode and a second electrode that is electrically connected to a gate of the first transistor, the first auxiliary display element overlaps the first transistor, the second transistor, and the storage capacitor.

One or more embodiments include a display apparatus that may include a substrate including a first auxiliary display area; a second auxiliary display area; and a transmission area surrounding the first auxiliary display area and the second auxiliary display area; a first auxiliary pixel circuit disposed in the first auxiliary display area; a first auxiliary conductive line disposed in the first auxiliary display area, extending in a first direction, and electrically connected to the first auxiliary pixel circuit; a second auxiliary pixel circuit disposed in the second auxiliary display area; a second auxiliary conductive line disposed in the second auxiliary display area, extending in the first direction, and electrically connected to the second auxiliary pixel circuit; and a first connection line at least partially overlapping the transmission area and electrically connecting the first auxiliary conductive line to the second auxiliary conductive line The substrate may include a third auxiliary display area surrounded by the transmission area, and the second auxiliary display area may be disposed between the first auxiliary display area and the third auxiliary display area, and the display apparatus may further include a third auxiliary pixel circuit disposed in the third auxiliary display area; a third auxiliary conductive line disposed in the third auxiliary display area, extending in the first direction and electrically connected to the third auxiliary pixel circuit; and a second connection line at least partially overlapping the transmission area and electrically connecting the second auxiliary conductive line to the third auxiliary conductive line.

The display apparatus may further include a first contact plug electrically connecting the first connection line to the second auxiliary conductive line; a second contact plug electrically connecting the second connection line to the second auxiliary conductive line; and a second auxiliary display element disposed in the second auxiliary display area and electrically connected to the second auxiliary pixel circuit, wherein the second auxiliary display element overlaps the first contact plug and the second contact plug.

The substrate may further include a third auxiliary display area surrounded by the transmission area, and the display apparatus may further include a third auxiliary pixel circuit disposed in the third auxiliary display area; and a third auxiliary conductive line disposed in the third auxiliary display area, extending in the first direction and electrically connected to the third auxiliary pixel circuit, the second auxiliary display area may be disposed between the first auxiliary display area and the third auxiliary display area, the first connection line may overlap the first auxiliary pixel circuit, the second auxiliary pixel circuit, and the third auxiliary pixel circuit, and the first connection line may extend in the first direction and electrically connects the second auxiliary conductive line to the third auxiliary conductive line.

The first connection line may have a higher light transmittance than a light transmittance the first auxiliary conductive line and the second auxiliary conductive line.

Other aspects, features, and advantages other than those described above will become apparent from the accompanying drawings, the appended claims, and the detailed description of the disclosure.

These general and other embodiments may be implemented by using a system, a method, a computer program, or a combination of the system, the method, and the computer program.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
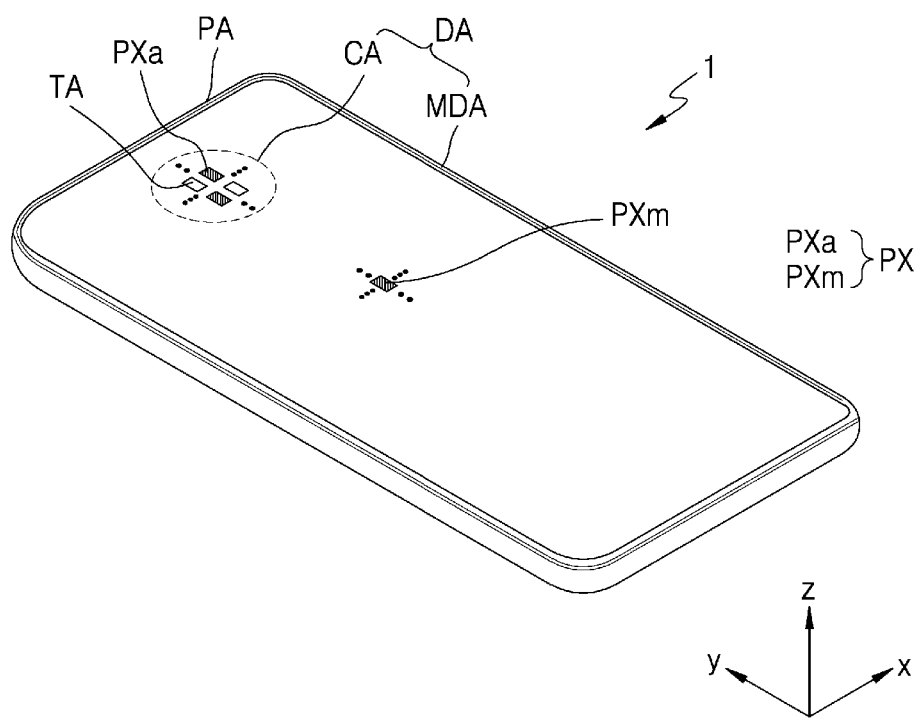
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. The effects and features of the disclosure, and ways to achieve them will become apparent by referring to embodiments that will be described later in detail with reference to the drawings. However, the disclosure is not limited to the following embodiments but may be embodied in various forms.

Hereinafter, embodiments of the disclosure will be described in detail with reference to the accompanying drawings, and in the description with reference to the drawings, like reference numerals refer to like elements and redundant descriptions thereof will be omitted.

It will be understood that although the terms "first," "second," etc., may be used herein to describe various elements, these elements should not be limited by these terms. These terms are only used to distinguish one element from another.

In embodiments below, the singular forms include the plural forms unless the context clearly indicates otherwise.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In embodiments below, it is to be understood that the terms such as ""comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof. In embodiments below, it will be understood that when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

When an embodiment is implementable in another manner, a process order may be different from a described one. For example, two processes that are consecutively described may be substantially simultaneously performed or may be performed in an opposite order to the described order.

In the specification, "A and/or B" refers to A, B, or A and B. In addition, "at least one of A and B" refers to A, B, or A and B.

In embodiments below, it will be understood that when a portion such as a layer, an area, or an element is referred to as being "connected" to another portion, it can be directly connected to the other portion, or/and an intervening portion may also be present. For example, throughout the specification, it will be understood when a portion such as a layer, an area, or an element is referred to as being "electrically connected" to another portion, it can be directly electrically connected to the other portion, and/or it can be indirectly electrically connected with an intervening portion therebetween.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

FIG. 1 is a schematic perspective view of a display apparatus according to an embodiment.

Referring to FIG. 1, a display apparatus 1 may include a display area DA and a peripheral area PA outside of the display area DA. The display area DA may include a component area CA and a main display area MDA at least partially surrounding or adjacent to the component area CA. The component area CA and the main display area MDA may display an image individually or jointly. The peripheral area PA may be a type of non-display area where no display element is arranged or disposed. The display area DA may be entirely surrounded by the peripheral area PA.

FIG. 1 illustrates that a single component area CA is located or disposed in the main display area MDA. According to an embodiment, the display apparatus 1 may include two or more component areas CA, and a shape and size of component areas CA may be different from one another. When viewed from a direction approximately perpendicular to an upper surface of the display apparatus 1, the component area CA may have various shapes such as substantially a circle, substantially an ellipse, a polygon including substantially a quadrangle, substantially a star shape, or substantially a diamond shape. Also, in FIG. 1, the component area CA arranged or disposed in an upper middle portion of the main display area MDA (+y direction) having an approximately quadrangular shape when viewed from the direction approximately perpendicular to the upper surface of the display apparatus 1 is illustrated. However, the component area CA may also be arranged or disposed at a side of the main display area MDA, for example, at a right upper side or a left upper side thereof.

The display apparatus 1 may provide an image by using pixels PX arranged or disposed in the display area DA. The display apparatus 1 may provide an image by using main pixels PXm arranged or disposed in the main display area MDA and auxiliary pixels PXa arranged or disposed in the component area CA. Each of the main pixels PXm and each of the auxiliary pixels PXa may include a display element. Each of the main pixels PXm and each of the auxiliary pixels PXa may include a display element such as an organic light-emitting diode OLED. Each pixel PX may emit light of, for example, red, green, blue or white light through the organic light-emitting diode OLED. Herein, each pixel PX refers to a sub-pixel emitting light of different colors, and each pixel PX may be one of a red sub-pixel, a green sub-pixel, and a blue sub-pixel.

As will be described later with reference to FIG. 2, a component 40, which is an electronic element, may be arranged or disposed in the component area CA under or below a display panel, to correspond to the component area CA. The component 40 may include a camera using an infrared ray or visible light or the like, and may include an imaging device. By way of example, the component 40 may include a solar cell, a flash, an illuminance sensor, a proximity sensor, or an iris sensor. By way of example, the component 40 may have a function of receiving sound. To minimize limitation of functions of the component 40, the component area CA may include a transmission area TA through which light or/and sound or the like that is output from the component 40 to the outside or proceeds from the outside to the component 40 may transmit. In a display panel according to an embodiment and a display apparatus including the display panel, in case that the component area CA transmits light, light transmittance may be about 10% or higher, about 40% or higher, about 25% or higher, about 50% or higher, about 85% or higher, or about 90% or higher.

The auxiliary pixels PXa may be arranged or disposed in the component area CA. The component area CA may include an auxiliary display area ADA as illustrated in FIG. 2 which will be described later, and the auxiliary pixels PXa may be arranged or disposed in the auxiliary display area ADA.

The auxiliary pixels PXa may emit light to provide an image. An image displayed in the component area CA may be an auxiliary image, and may have a lower resolution than an image displayed in the main display area MDA. For example, the component area CA may include the transmission area TA through which light and sound may transmit, and in case that no pixel is arranged or disposed in the transmission area TA, the number of auxiliary pixels PXa to be arranged or disposed in the component area CA per unit area may be less than the number of main pixels PXm arranged or disposed in the main display area MDA per unit area. This will be described in further detail with reference to FIG. 3.

Figure 2:
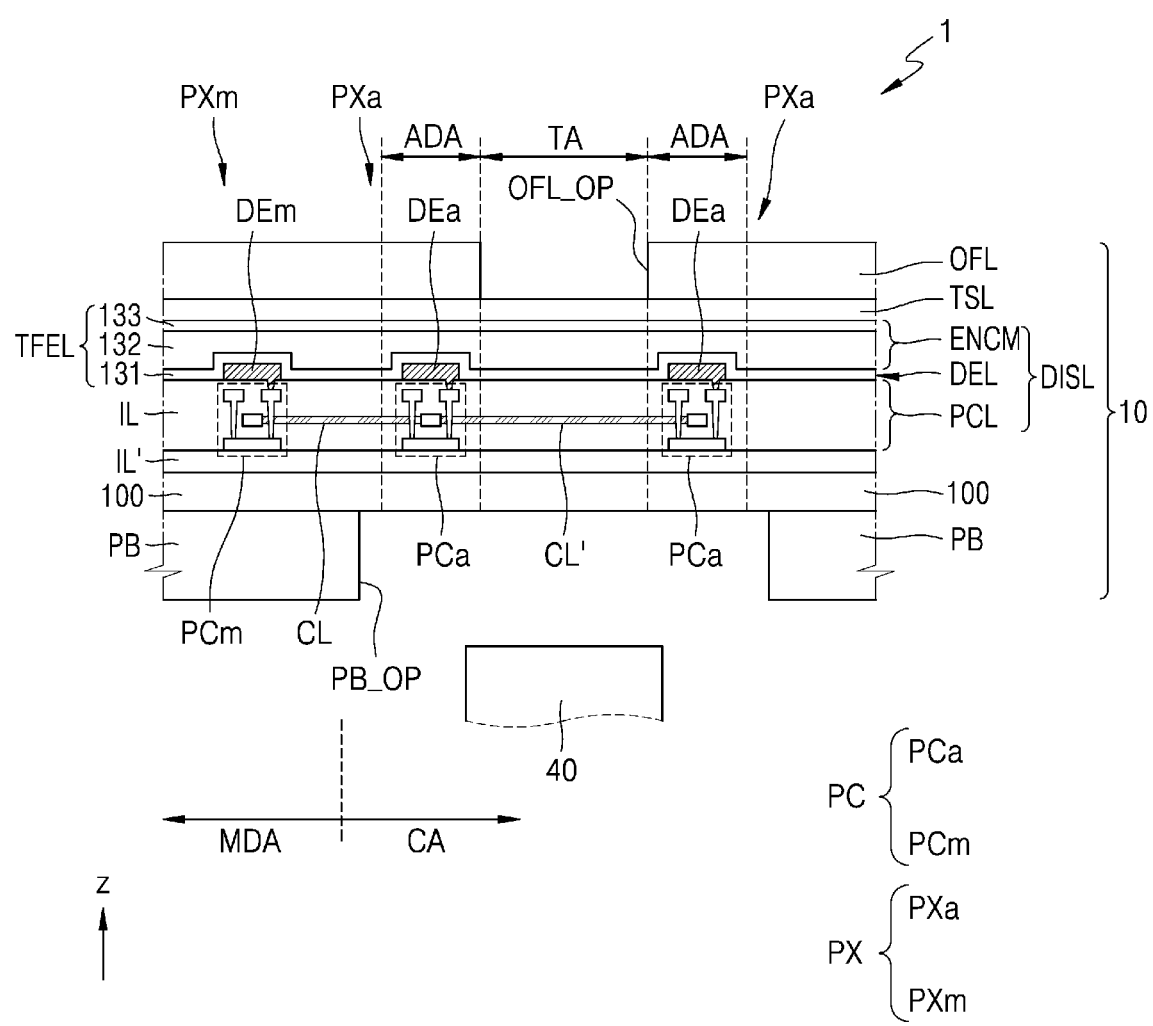
FIG. 2 is a schematic cross-sectional view schematically illustrating a display apparatus according to an embodiment.

FIG. 2 is a schematic cross-sectional view schematically illustrating a display apparatus 1 according to an embodiment.

Referring to FIG. 2, the display apparatus 1 may include a display panel 10 and a component 40 overlapping the display panel 10. A cover window (not shown) protecting the display panel 10 may be further arranged or disposed above the display panel 10.

The display panel 10 may include the component area CA overlapping the component 40 and the main display area MDA on which a main image is displayed. As the display panel 10 may include a substrate 100 as will be described later, it may also be said that the substrate 100 may include the component area CA and the main display area MDA. In other words, the component area CA and the main display area MDA may be defined in the substrate 100.

The display panel 10 may include the substrate 100, a display layer DISL, a touch screen layer TSL, and an optical functional layer OFL on the substrate 100, and a panel protection member PB arranged or disposed under or below the substrate 100.

The display layer DISL may include a circuit layer PCL including a pixel circuit PC including a transistor (for example, a thin-film transistor), a display element layer DEL including main and auxiliary display elements DEm and DEa, and an encapsulation member ENCM such as a thin-film encapsulation layer or an encapsulation substrate (not shown). Insulating layers IL and IL' may be between the substrate 100 and the display layer DISL and in the display layer DISL.

The substrate 100 may include an insulating material such as glass, quartz, or a polymer resin. The substrate 100 may include a rigid substrate or a flexible substrate that is bendable, foldable, rollable, or the like within the spirit and the scope of the disclosure.

The main pixel PXm may be arranged or disposed in the main display area MDA of the display panel 10. The main pixel PXm may include a main pixel circuit PCm and a main display element DEm electrically connected to the main pixel circuit PCm. The main pixel circuit PCm may include at least one transistor and control emission of the main display element DEm. The main pixel PXm may be implemented by using light emission of the main display element DEm.

The auxiliary pixel PXa may be arranged or disposed in the component area CA of the display panel 10. The auxiliary pixel PXa may include an auxiliary pixel circuit PCa and the auxiliary display element DEa electrically connected to the auxiliary pixel circuit PCa. The auxiliary pixel circuit PCa may include at least one transistor and control emission of the auxiliary display element DEa. The auxiliary pixel PXa may be implemented by using light emission of the auxiliary display element DEa.

An area of the component area CA where the auxiliary pixel PXa is arranged or disposed may be referred to as the auxiliary display area ADA. Also, an area of the component area CA where the auxiliary pixel PXa is not arranged or disposed may be referred to as the transmission area TA. The transmission area TA may include an area through which light or a signal emitted from the component 40 arranged or disposed to correspond to the component area CA or light or a signal incident to the component 40 are transmitted. The auxiliary display area ADA and the transmission area TA may be alternately arranged or disposed in the component area CA. The transmission area TA may surround the auxiliary display area ADA.

According to an embodiment, the main pixel circuit PCm and the auxiliary pixel circuit PCa may be electrically connected to each other via a connection line CL. For example, a main conductive line of the main pixel circuit PCm and an auxiliary conductive line of the auxiliary pixel circuit PCa may be electrically connected to each other via the connection line CL. The main conductive line may include a main gate line, and the auxiliary conductive line may include an auxiliary gate line. By way of example, the main conductive line may include a main data line, and the auxiliary conductive line may include an auxiliary data line. Thus, a gate signal and/or a data voltage supplied to the main pixel circuit PCm may also be supplied to the auxiliary pixel circuit PCa.

Also, the auxiliary pixel circuits PCa may be electrically connected to each other via a connection line CL'. For example, auxiliary conductive lines of the auxiliary pixel circuits PCa may be electrically connected to each other via the connection line CL'. Thus, the auxiliary pixel circuits PCa may share with one another a gate signal and/or a data voltage received from the main pixel circuit PCm.

Thus, the auxiliary pixel circuits PCa may receive a gate signal and/or a data voltage from an adjacent main pixel circuit PCm. Thus, the auxiliary pixel circuits PCa may control the auxiliary display elements DEa in the same manner as the main pixel circuit PCm does.

According to an embodiment, the connection lines CL and CL' may at least partially overlap the transmission area TA. The connection lines CL and CL' may include a transparent conductive material having high transmittance, and thus, even in case that the connection lines CL and CL' are arranged or disposed to at least partially overlap the transmission area TA, transmittance of the transmission area TA may be ensured.

The display element layer DEL may be covered or overlapped using the thin-film encapsulation layer TFEL or an encapsulation substrate. In an embodiment, the thin-film encapsulation layer TFEL may include at least one inorganic encapsulation layer and at least one organic encapsulation layer as illustrated in FIG. 2. According to an embodiment, the thin-film encapsulation layer TFEL may include a first inorganic encapsulation layer 131 and a second inorganic encapsulation layer 133 and an organic encapsulation layer 132 therebetween.

The first inorganic encapsulation layer 131 and the second inorganic encapsulation layer 133 may include at least one inorganic insulating material such as silicon oxide ($SiO_2$), silicon nitride ($SiN_x$) silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO), and may be formed using, for example, a chemical vapor deposition (CVD) method. The organic encapsulation layer 132 may include a polymer-based material. Examples of the polymer-based material may include a silicon resin, an acrylic resin, an epoxy resin, polyimide (PI), and polyethylene.

The first inorganic encapsulation layer 131, the organic encapsulation layer 132, and the second inorganic encapsulation layer 133 may be integral with each other as a single body to cover or overlap the main display area MDA and the component area CA.

In case that the display element layer DEL is encapsulated using an encapsulation substrate (not shown), the encapsulation substrate may be arranged or disposed to face the substrate 100 with the display element layer DEL therebetween. There may be a gap between the encapsulation substrate and the display element layer DEL. The encapsulation substrate may include glass. A sealant including a frit or the like may be arranged or disposed between the substrate 100 and the encapsulation substrate, and the sealant may be arranged in the peripheral area PA illustrated in FIG. 1. The sealant arranged or disposed in the peripheral area PA may surround the display area DA and prevent lateral penetration of moisture.

The touch screen layer TSL may acquire coordinate information according to an external input, for example, a touch event. The touch screen layer TSL may include a touch electrode and touch wirings electrically connected to the touch electrode. The touch screen layer TSL may sense an external input by using a self-capacitance method or a mutual capacitance method.

The touch screen layer TSL may be formed or disposed on the thin-film encapsulation layer TFEL. By way of example, the touch screen layer TSL may be separately formed or disposed on a touch substrate and coupled or connected onto the thin-film encapsulation layer TFEL by using an adhesive layer such as an optically clear adhesive (OCA). According to an embodiment, the touch screen layer TSL may be formed or disposed on or may be directly formed or disposed on the thin-film encapsulation layer TFEL, and, the adhesive layer may not be between the touch screen layer TSL and the thin-film encapsulation layer TFEL.

The optical functional layer OFL may include an anti-reflection layer. The anti-reflection layer may reduce reflectance of light incident from the outside to the display apparatus 1 (external light).

In an embodiment, the optical functional layer OFL may include a polarization film. The optical functional layer OFL may include an opening OFL_OP corresponding to the transmission area TA. Accordingly, light transmittance of the transmission area TA may be significantly improved. The opening OFL_OP of the optical functional layer OFL may be filled with a transparent material such as an optically clear resin (OCR).

In an embodiment, the optical functional layer OFL may include a filter plate including a black matrix and color filters.

The panel protection member PB may be attached under or below the substrate 100 to support and protect the substrate 100. The panel protection member PB may include an opening PB_OP corresponding to the component area CA. As the panel protection member PB may include the opening PB_OP, the light transmittance of the component area CA may be improved. The panel protection member PB may include polyethylene terephthalate (PET) or PI.

The component area CA may have a larger area than an area where the component 40 is arranged or disposed. Accordingly, an area of the opening PB_OP included in the panel protection member PB may not be equal to the area of the component area CA.

Also, components 40 may be arranged or disposed in the component area CA. The components 40 may have different functions from each other. For example, the components 40 may include at least two of a camera (imaging device), a solar cell, a flash, a proximity sensor, an illuminance sensor, and an iris sensor.

Although not illustrated in FIG. 2, a bottom metal layer may be arranged or disposed below the auxiliary pixel PXa of the component area CA. The bottom metal layer may be arranged or disposed below the auxiliary display element DEa constituting the auxiliary pixel PXa. For example, the display apparatus 1 may include the bottom metal layer.

The bottom metal layer may be arranged or disposed to overlap the auxiliary display element DEa between the substrate 100 and the auxiliary display element DEa. The bottom metal layer may block external light from reaching the auxiliary display element DEa. The bottom metal layer may be formed to correspond to the entire component area CA, and may include a bottom hole corresponding to the transmission area TA. The bottom hole may have various shapes such as substantially a polygon, substantially a circle, or an amorphous shape to adjust diffraction characteristics of external light.

Figure 3:
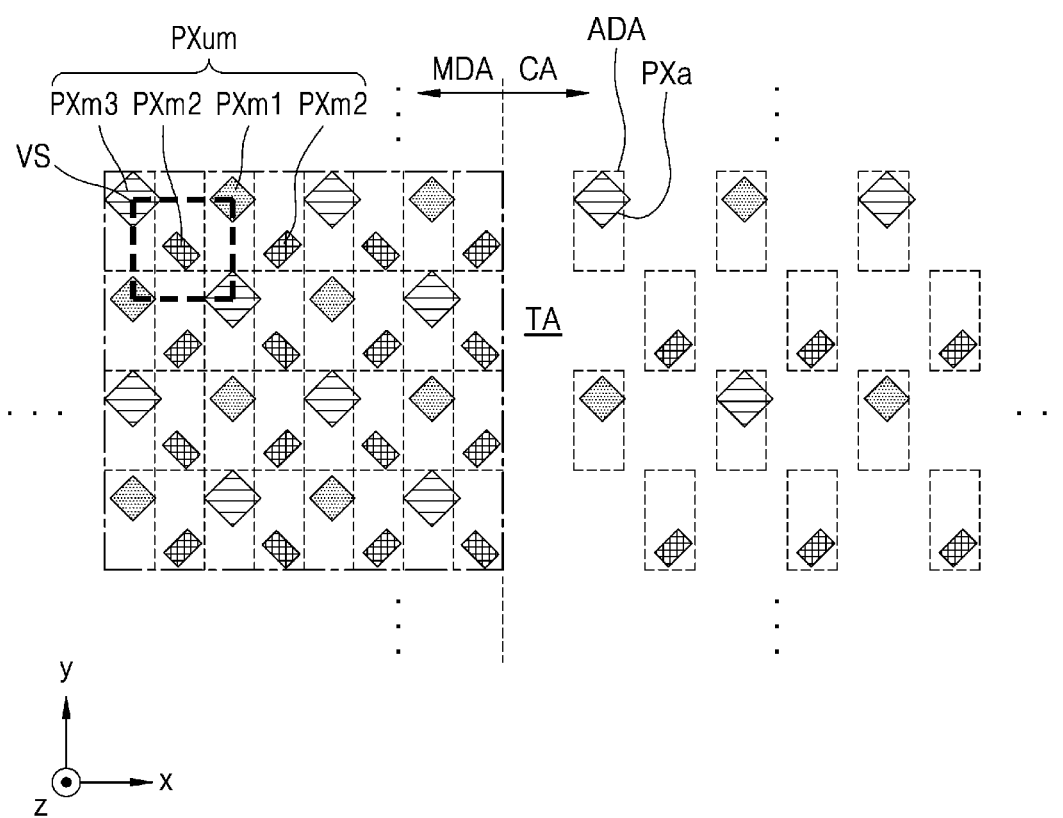
FIG. 3 is a schematic enlarged plan view of a portion of a display apparatus according to an embodiment.

FIG. 3 is a schematic enlarged plan view of a portion of a display apparatus according to an embodiment.

Referring to FIG. 3, main pixel units PXum may be arranged or disposed in the main display area MDA. Each of the main pixel units PXum may include a first main pixel PXm1, a second main pixel PXm2, and a third main pixel PXm3. The first main pixel PXm1, the second main pixel PXm2, and the third main pixel PXm3 may emit light of different colors from each other. For example, the first main pixel PXm1 may emit red light, the second main pixel PXm2 may emit green light, and the third main pixel PXm3 may emit blue light.

According to an embodiment, the first main pixel PXm1, the second main pixel PXm2, and the third main pixel PXm3 may be arranged or disposed in a PenTile® type arrangement.

For example, from among vertices of a virtual square VS having a center point of the second main pixel PXm2 as a center point of the square, the first main pixel PXm1 may be placed at first and third vertices of the virtual square VS, and the third main pixel PXm3 may be placed at second and fourth vertices of the virtual square VS. The virtual square VS may be modified to various shapes such as substantially a rectangle, substantially a rhombus, or substantially a square.

The above-described pixel arrangement is referred to as a PenTile® matrix structure or a PenTile® structure, and a high resolution may be obtained using a small number of pixels by applying rendering driving whereby colors are expressed by sharing adjacent pixels.

The main pixel units PXum arranged or disposed in the main display area MDA in a PenTile® matrix structure are illustrated in FIG. 3, but the disclosure is not limited thereto.

According to an embodiment, the main pixel units PXum, for example, the first main pixel PXm1, the second main pixel PXm2, and the third main pixel PXm3 may be arranged or disposed in a stripe arrangement, a mosaic arrangement, a delta arrangement or the like within the spirit and the scope of the disclosure.

According to an embodiment, as illustrated in FIG. 3, the third main pixel PXm3 and the first main pixel PXm1 may have a greater size (or width) than a size (or width) of the second main pixel PXm2.

The auxiliary pixels PXa may be respectively arranged or disposed in the auxiliary display areas ADA of the component area CA. The auxiliary pixels PXa may emit light of different colors. For example, the auxiliary pixels PXa may respectively emit light of any one of red, green, and blue colors.

The component area CA may include the transmission area TA. The transmission area TA may be arranged or disposed to surround each of the auxiliary display areas ADA. As the auxiliary pixels PXa may be respectively arranged or disposed in the auxiliary display areas ADA, the transmission area TA may be arranged or disposed to surround each auxiliary pixel PXa. By way of example, the transmission area TA may be arranged or disposed in a lattice form with respect to the auxiliary pixels PXa.

As the component area CA has the transmission area TA, a resolution of the component area CA may be lower than a resolution of the main display area MDA. For example, the resolution of the component area CA may be about ½, ⅜, ⅓, ¼, ⅔, ⅛, ⅑, 1/12.25, or 1/16 of the resolution of the main display area MDA. The resolution of the main display area MDA may be equal to or higher than about 400 ppi, and the resolution of the component area CA may be about 200 ppi or about 100 ppi.

In other words, the number of auxiliary pixels PXa arranged or disposed in the component area CA per unit area may be less than the number of main pixels PXm arranged or disposed in the main display area MDA per unit area. For example, the number of auxiliary pixels PXa and the number of the main pixels PXm, each arranged or disposed in an equal area, may be provided in a ratio of, for example, about 1:2, about 1:4, about 1:8, about 1:9, or about 1:12.25. As the main pixel PXm may include the main display element DEm (FIG. 2), and the auxiliary pixel PXa may include the auxiliary display element DEa (FIG. 2), the number of auxiliary pixels PXa per unit area may be regarded to be less than the number of the main display elements DEm per unit area.

The auxiliary pixels PXa arranged or disposed in the component area CA may be arranged or disposed in various forms.

According to an embodiment, some or a part of the auxiliary pixels PXa may be grouped into a pixel group, and the auxiliary pixels PXa may be arranged or disposed in various forms such as a PenTile® structure, a stripe arrangement, a mosaic arrangement, a delta arrangement or the like, in each pixel group. A distance between the auxiliary pixels PXa arranged or disposed in a pixel group may be equal to a distance between the main pixels PXm.

By way of example, according to an embodiment, the auxiliary pixels PXa may be distributed within the component area CA as illustrated in FIG. 3.

Figure 4:
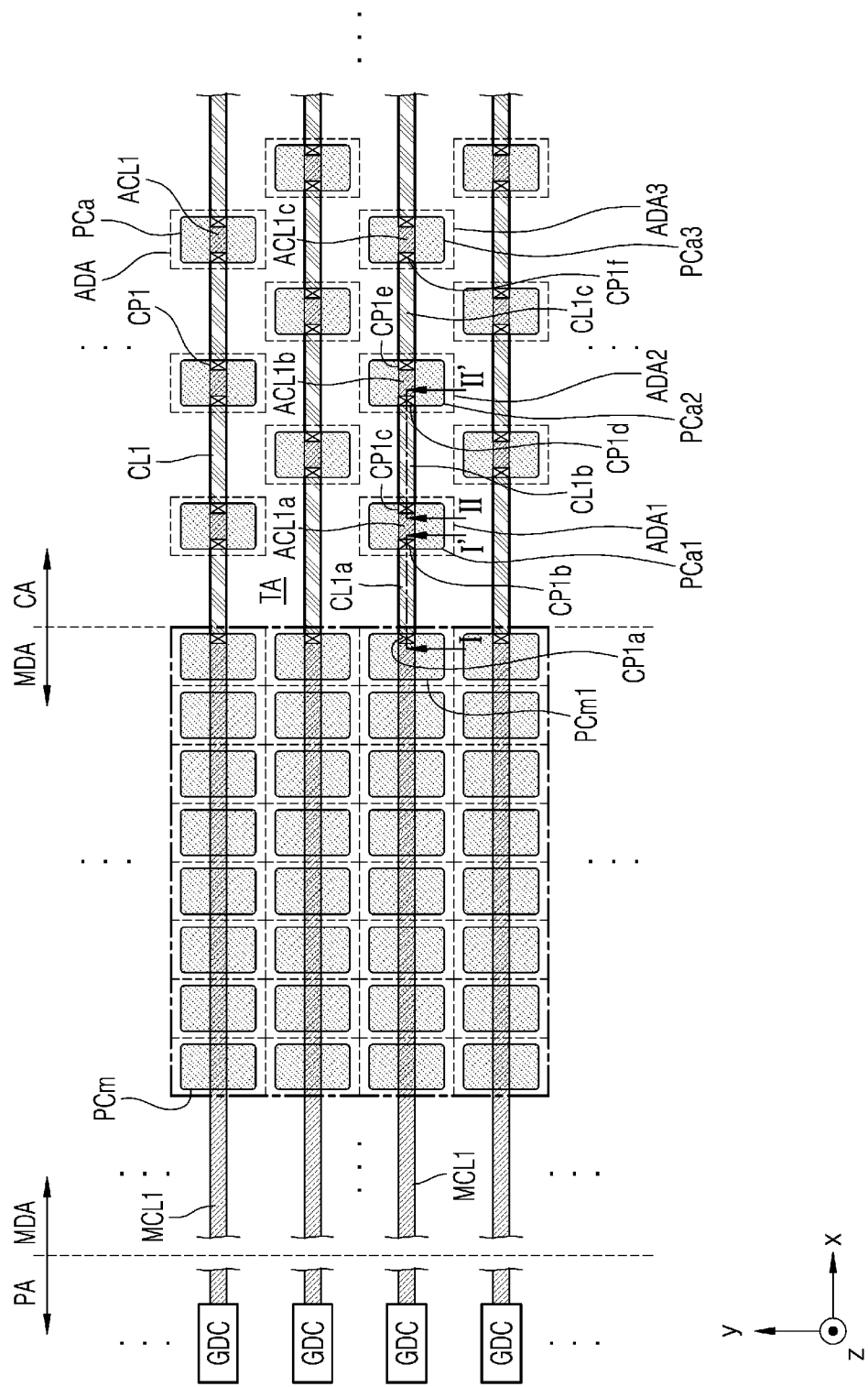
FIG. 4 is a schematic enlarged plan view of a portion of a display apparatus according to an embodiment.

FIG. 4 is a schematic enlarged plan view of a region of a display apparatus according to an embodiment.

Referring to FIG. 4, main pixel circuits PCm and first main conductive lines MCL1 respectively constituting the main pixels PXm (FIG. 3) may be arranged or disposed in the main display area MDA.

The main pixel circuits PCm may be arranged or disposed in a first direction (for example, ±x direction) and a second direction (for example, ±y direction). The main pixel circuits PCm may be respectively electrically connected to outer circuits arranged or disposed in the peripheral area PA.

Gate driving circuits GDC may be arranged or disposed in the peripheral area PA. The gate driving circuits GDC may be arranged or disposed in the second direction (for example, ±y direction) in the peripheral area PA as illustrated in FIG. 4. The gate driving circuits GDC may be electrically connected to the first main conductive lines MCL1 respectively extending in the first direction (for example, ±x direction).

The first main conductive lines MCL1 may be respectively electrically connected to the main pixel circuits PCm located or disposed in same rows. The first main conductive lines MCL1 may respectively transfer an electrical signal to the main pixel circuits PCm located or disposed in same rows.

For example, as illustrated in FIG. 4, a first main pixel circuit PCm1 which is one of the main pixel circuits PCm may be electrically connected to the first main conductive line MCL1 extending in the first direction (for example, ±x direction).

While each of the first main conductive lines MCL1 is illustrated as a single wiring in FIG. 4, the first main conductive lines MCL1 may each include wirings. For example, each of the first main conductive lines MCL1 may include a main scan line, a main emission control line, or the like within the spirit and the scope of the disclosure. This will be described in further detail later with reference to FIG. 11.

The auxiliary pixel circuits PCa, first auxiliary conductive lines ACL1, and first connection lines CL1 respectively constituting the auxiliary pixels PXa (FIG. 3) may be arranged or disposed in the component area CA.

The first auxiliary conductive lines ACL1 may respectively extend in the first direction (for example, ±x direction) to be electrically connected to the auxiliary pixel circuits PCa.

For example, as illustrated in FIG. 4, a first auxiliary pixel circuit PCa1, which is one of the auxiliary pixel circuits PCa, may be electrically connected to a 1-1$^{st}$ auxiliary conductive line ACL1a extending in the first direction (for example, ±x direction), and a second auxiliary pixel circuit PCa2, which is another one of the auxiliary pixel circuits PCa, may be electrically connected to a 1-2$^{nd}$ auxiliary conductive line ACL1b extending in the first direction (for example, ±x direction), and a third auxiliary pixel circuit PCa3, which is another one of the auxiliary pixel circuits PCa, may be electrically connected to a 1-3$^{rd}$ auxiliary conductive line ACL1c extending in the first direction (for example, ±x direction).

Here, the auxiliary display area ADA, in which the first auxiliary pixel circuit PCa1 is arranged or disposed, from among the auxiliary display areas ADA, may be referred to as a first auxiliary display area ADA1; the auxiliary display area ADA, in which the second auxiliary pixel circuit PCa2 is arranged or disposed, from among the auxiliary display areas ADA, may be referred to as a second auxiliary display area ADA2; and the auxiliary display area ADA, in which the third auxiliary pixel circuit PCa3 is arranged or disposed, from among the auxiliary display areas ADA, may be referred to as a third auxiliary display area ADA3.

While each of the first auxiliary conductive lines ACL1 is illustrated as a single wiring in FIG. 4, each of the first auxiliary conductive lines ACL1 may include wirings. For example, each of the first auxiliary conductive lines ACL1 may include an auxiliary scan line, an auxiliary emission control line, or the like within the spirit and the scope of the disclosure. As each of the first auxiliary conductive lines ACL1 may include wirings, each of the first connection lines CL1 may also include wirings. This will be described in further detail later with reference to FIG. 11.

Each of the first connection lines CL1 may extend in the first direction (for example, ±x direction) to electrically connect the first main conductive line MCL1 to the first auxiliary conductive line ACL1 or electrically connect the first auxiliary conductive lines ACL1 electrically connected to different auxiliary pixel circuits PCa to one another.

In other words, some or a part of the first connection lines CL1 may electrically connect the first main conductive line MCL1 to the first auxiliary conductive line ACL1. Some others of the first connection lines CL1 may electrically connect the first auxiliary conductive lines ACL1 electrically connected to different auxiliary pixel circuits PCa, to one another.

For example, as illustrated in FIG. 4, a 1-1$^{st}$ connection line CL1a, which is one of the first connection lines CL1, may electrically connect the first main conductive line MCL1 to the 1-1$^{st}$ auxiliary conductive line ACL1a. A 1-2$^{nd}$ connection line CL1b, which is another one of the first connection lines CL1, may electrically connect the 1-1$^{st}$ auxiliary conductive line ACL1a to the 1-2$^{nd}$ auxiliary conductive line ACL1b. A 1-3$^{rd}$ connection line CL1c, which is another one of the first connection lines CL1, may electrically connect the 1-2$^{nd}$ auxiliary conductive line ACL1b to the 1-3$^{rd}$ auxiliary conductive line ACL1c.

The first main conductive line MCL1 and the first auxiliary conductive line ACL1 that are electrically connected to each other via the first connection line CL1, from among the first main conductive lines MCL1 and the first auxiliary conductive lines ACL1, may be apart from each other in the first direction (for example, ±x direction). The first auxiliary conductive lines ACL1 electrically connected to each other via the first connection line CL1, from among the first auxiliary conductive lines ACL1, may be apart from each other in the first direction (for example, ±x direction). The transmission area TA may be between the first main conductive line MCL1 and the first auxiliary conductive line ACL1 that are apart from each other in the first direction (for example, ±x direction). The transmission area TA may be arranged or disposed between the first auxiliary conductive lines ACL1 that are apart from each other in the first direction (for example, ±x direction).

For example, as illustrated in FIG. 4, the first main conductive line MCL1 and the 1-1$^{st}$ auxiliary conductive line ACL1a, the 1-1$^{st}$ auxiliary conductive line ACL1a and the 1-2$^{nd}$ auxiliary conductive line ACL1b, and the 1-2$^{nd}$ auxiliary conductive line ACL1b and the 1-3$^{rd}$ auxiliary conductive line ACL1c may be respectively apart from each other in the first direction (for example, ±x direction). The transmission area TA may be arranged or disposed between the first main conductive line MCL1 and the 1-1$^{st}$ auxiliary conductive line ACL1a, between the 1-1$^{st}$ auxiliary conductive line ACL1a and the 1-2$^{nd}$ auxiliary conductive line ACL1b, and between the 1-2$^{nd}$ auxiliary conductive line ACL1b and the 1-3$^{rd}$ auxiliary conductive line ACL1c.

As described above, in case that the first main conductive line MCL1 and the first auxiliary conductive line ACL1 that are apart from each other in the first direction (for example, ±x direction) are electrically connected to each other via the first connection line CL1, and the first auxiliary conductive lines ACL1 that are apart from each other in the first direction (for example, ±x direction) are electrically connected to each other via the first connection line CL, an electrical signal supplied from the gate driving circuit GDC may be transferred to each of the main pixel circuits PCm and the auxiliary pixel circuits PCa arranged or disposed in the first direction (for example, ±x direction).

As illustrated in FIG. 1, the main display area MDA may surround the component area CA. The first main conductive lines MCL1 that are apart from each other in the first direction (for example, ±x direction) by the component area CA may be electrically connected to each other via the first connection lines CL1 and the first auxiliary conductive lines ACL1.

According to an embodiment, the first connection line CL1 and the first main conductive line MCL1 may be electrically connected to each other via a first contact plug CP1. The first connection line CL1 and the first auxiliary conductive line ACL1 may be electrically connected to each other via the first contact plug CP1.

For example, as illustrated in FIG. 4, the 1-1$^{st}$ connection line CL1a and the first main conductive line MCL1 may be electrically connected to each other via a 1-1$^{st}$ contact plug CP1a, and the 1-1$^{st}$ connection line CL1a and the 1-1$^{st}$ auxiliary conductive line ACL1a may be electrically connected to each other via a 1-2$^{nd}$ contact plug CP1b. The 1-2$^{nd}$ connection line CL1b and the 1-1$^{st}$ auxiliary conductive line ACL1a may be electrically connected to each other via a 1-3$^{rd}$ contact plug CP1c, and the 1-2$^{nd}$ connection line CL1b and the 1-2$^{nd}$ auxiliary conductive line ACL1b may be electrically connected to each other via a 1-4$^{th}$ contact plug CP1d. The 1-3$^{rd}$ connection line CL1c and the 1-2$^{nd}$ auxiliary conductive line ACL1b may be electrically connected to each other via a 1-5$^{th}$ contact plug CP1e, and the 1-3$^{rd}$ connection line CL1c and the 1-3$^{rd}$ auxiliary conductive line ACL1c may be electrically connected to each other via a 1-6$^{th}$ contact plug CP1f.

Figure 5:
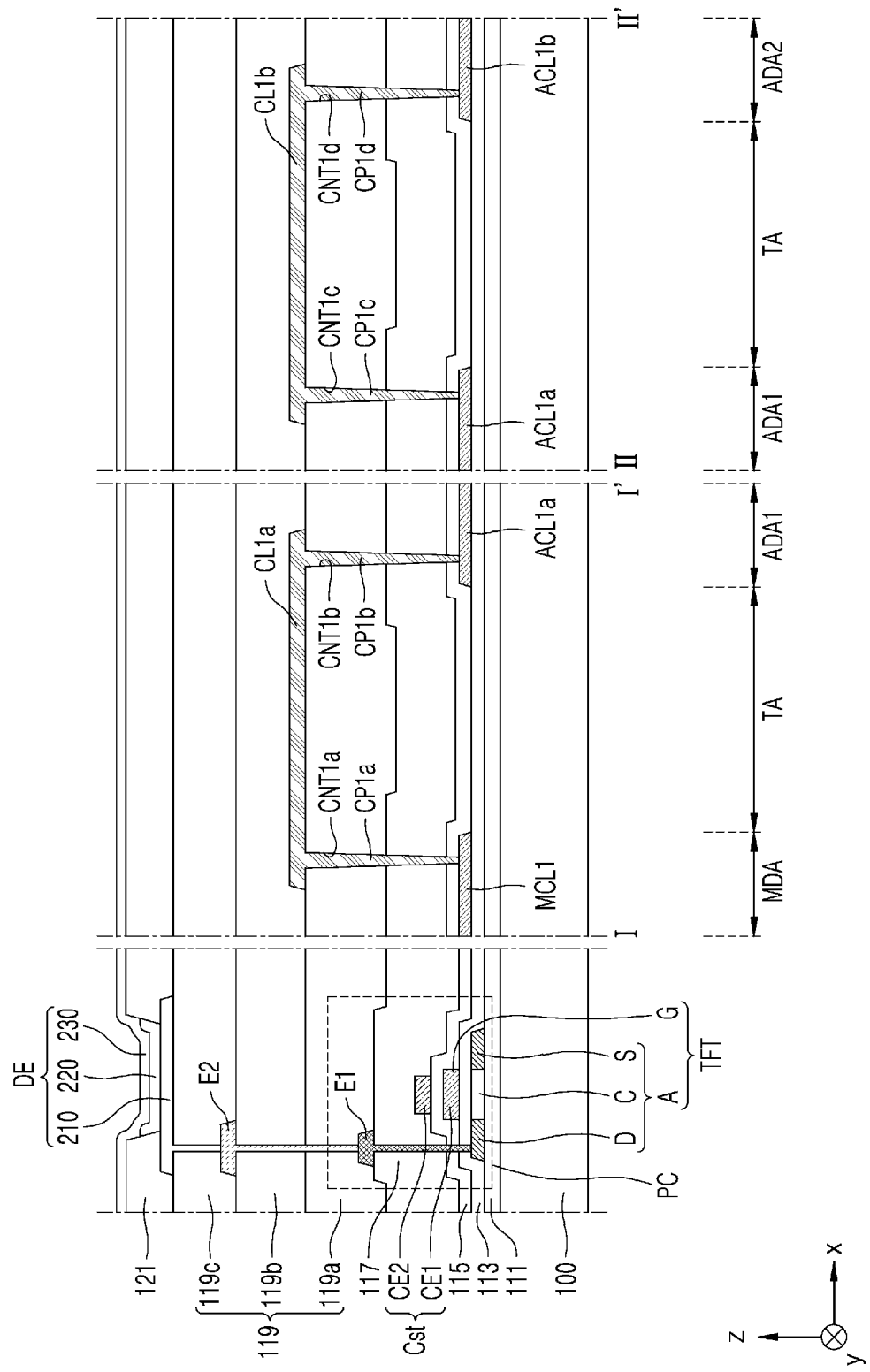
FIG. 5 is a schematic cross-sectional view of a portion of FIG. 4 taken along line I-I' and line II-II'.
Figure 6:
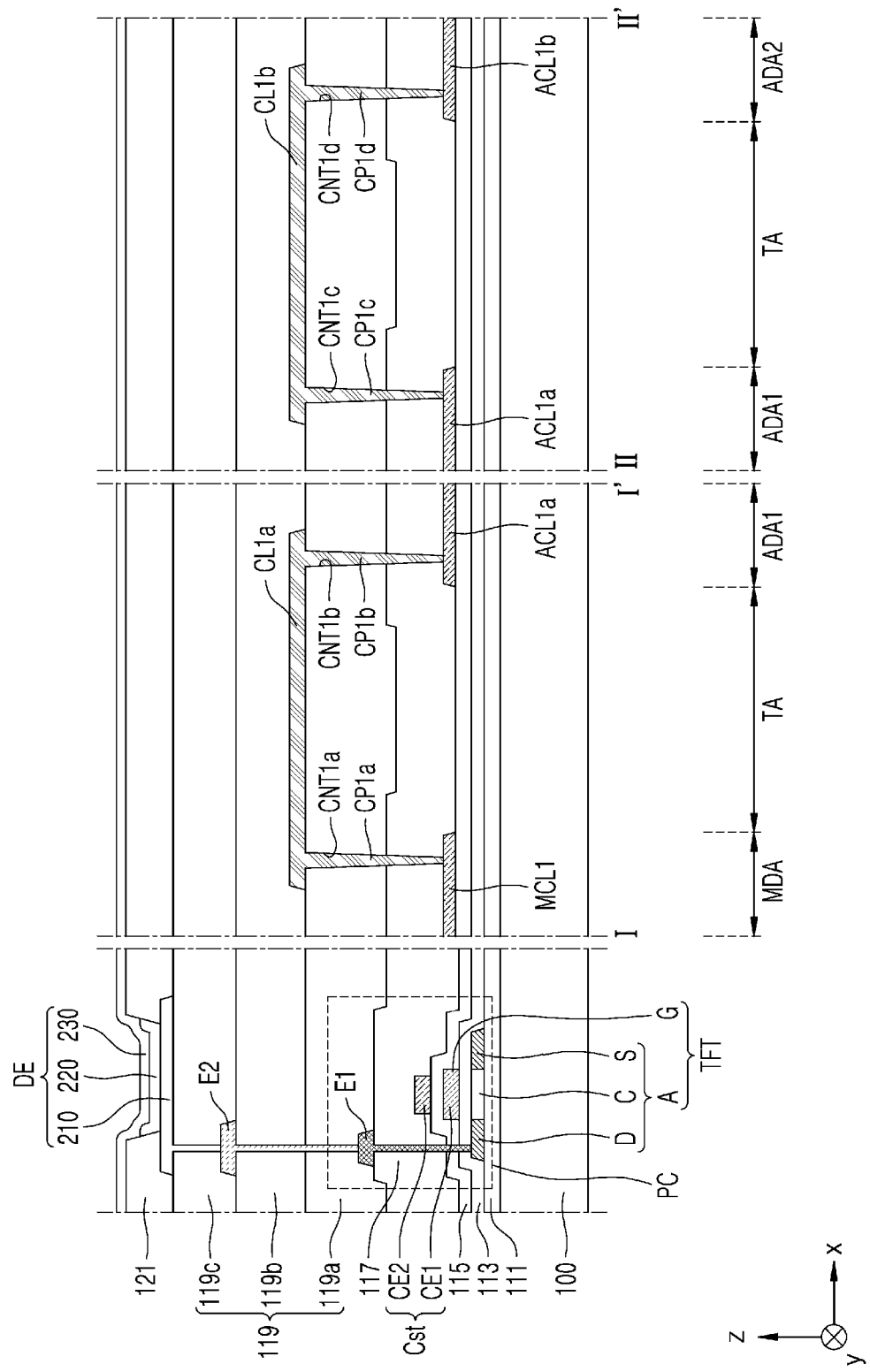
FIG. 6 is a schematic cross-sectional view of a portion of FIG. 4 taken along line I-I' and line II-II'.

As illustrated in FIGS. 5 and 6 to be described later, some or a part of the first connection lines CL1 may be buried in a contact hole formed in an insulating layer. A portion of the first connection line CL1 buried in the contact hole may be referred to as the first contact plug CP1. In other words, the first connection line CL1 and the first contact plug CP1 may be a single body.

According to an embodiment, the first connection line CL1 may have higher light transmittance than the first main conductive line MCL1 and the first auxiliary conductive line ACL1. The first connection line CL1 may include a transparent conducting oxide (TCO). For example, the first connection line CL1 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

According to an embodiment, as illustrated in FIG. 4, each of the first connection lines CL1 may at least partially overlap the transmission area TA. As described above, the first connection line CL1 may include a transparent conductive material having high transmittance, and thus, even in case that the first connection line CL1 is arranged or disposed to at least partially overlap the transmission area TA, transmittance of the transmission area TA may be ensured.

FIGS. 5 and 6 are schematic cross-sectional views of a portion of FIG. 4 taken along line I-I' and line II-II'.

FIGS. 5 and 6 illustrate cross-sections of a pixel circuit PC including at least one transistor TFT, the first main conductive line MCL1, the first connection line CL1 (FIG. 4), and the first auxiliary conductive line ACL1 (FIG. 4). The pixel circuit PC may be the main pixel circuit PCm (FIG. 4) arranged or disposed in the main display area MDA or the auxiliary pixel circuit PCa (FIG. 4) arranged or disposed in the auxiliary display area ADA (FIG. 4).

Hereinafter, a configuration included in the display apparatus will be described in detail according to a stack structure thereof by referring to FIGS. 5 and 6, and positional relationships of the first main conductive line MCL1, the first connection line CL1, and the first auxiliary conductive line ACL1 will be described.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate or cellulose acetate propionate. The substrate 100 including the polymer resin may be flexible, rollable, or bendable. The substrate 100 may have a multi-layer structure including a layer including the above-described polymer resin and an inorganic layer (not shown).

The buffer layer 111 may reduce or block penetration of foreign substances, moisture, or outside air from below the substrate 100, and may provide a flat surface on the substrate 100. The buffer layer 111 may include an inorganic material such as oxide or nitride, an organic material, or an organic-inorganic complex material, and may have a single-layer or multi-layer structure including an inorganic material and an organic material.

A barrier layer (not shown) may be further included between the substrate 100 and the buffer layer 111. The barrier layer may prevent or minimize penetration of impurities from the substrate 100 or the like into a semiconductor layer A. The barrier layer may include an inorganic material such as oxide or nitride, an organic material, or an organic-inorganic complex material, and may have a single-layer or multi-layer structure including an inorganic material and an organic material.

The semiconductor layer A may be arranged or disposed on the buffer layer 111. The semiconductor layer A may include amorphous silicon or polysilicon. According to an embodiment, the semiconductor layer A may include an oxide of at least one material from among indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel region C and a source region S and a drain region D arranged or disposed on both sides of the channel region C. The semiconductor layer A may include a single layer or multiple layers.

A first gate insulating layer 113 and a second gate insulating layer 115 may be stacked each other and arranged or disposed above the substrate 100 to cover or overlap the semiconductor layer A. For example, the first gate insulating layer 113 and the second gate insulating layer 115 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

A first conductive layer may be arranged or disposed above the first gate insulating layer 113. The first conductive layer may have a single-layer or multi-layer structure including molybdenum (Mo), aluminum (Al), copper (Cu), titanium (Ti), or the like within the spirit and the scope of the disclosure. For example, the first conductive layer may include a single layer of Mo.

A second conductive layer may be arranged or disposed above the second gate insulating layer 115. The second conductive layer may have a single-layer or multi-layer structure including molybdenum (Mo), aluminum (Al), copper (Cu), titanium (Ti), or the like within the spirit and the scope of the disclosure. For example, the second conductive layer may include a single layer of Mo.

The first conductive layer may include a gate electrode G. The gate electrode G may be arranged or disposed to at least partially overlap the semiconductor layer A.

The second conductive layer may include an upper electrode CE2 of a storage capacitor Cst.

According to an embodiment, the storage capacitor Cst may include a lower electrode CE1 and the upper electrode CE2, and may overlap the transistor TFT as illustrated in FIGS. 5 and 6. For example, the gate electrode G of the transistor TFT may function as the lower electrode CE1 of the storage capacitor Cst. By way of example, the storage capacitor Cst may not overlap the transistor TFT, but may exist separately therefrom.

The upper electrode CE2 of the storage capacitor Cst may overlap the lower electrode CE1 with the second gate insulating layer 115 therebetween, and form capacitance. The second gate insulating layer 115 may function as a dielectric layer of the storage capacitor Cst.

According to an embodiment, as illustrated in FIG. 5, the first conductive layer may include the first main conductive line MCL1 and the first auxiliary conductive line ACL1. In other words, the first main conductive line MCL1 and the first auxiliary conductive line ACL1 may be arranged or disposed on an upper surface of the first gate insulating layer 113. FIG. 5 illustrates, as an example, the 1-1$^{st}$ auxiliary conductive line ACL1$a$ and the 1-2$^{nd}$ auxiliary conductive line ACL1$b$ from among the first auxiliary conductive lines ACL1.

According to an embodiment, as illustrated in FIG. 6, the second conductive layer may include the first main conductive line MCL1 and the first auxiliary conductive line ACL1. In other words, the first main conductive line MCL1 and the first auxiliary conductive line ACL1 may be arranged or disposed on an upper surface of the second gate insulating layer 115. FIG. 6 illustrates, as an example, the 1-1$^{st}$ auxiliary conductive line ACL1$a$ and the 1-2$^{nd}$ auxiliary conductive line ACL1$b$ from among the first auxiliary conductive lines ACL1.

An interlayer insulating layer 117 may be provided or disposed on the second gate insulating layer 115 to cover or overlap the upper electrode CE2 of the storage capacitor Cst. The interlayer insulating layer 117 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

A third conductive layer may be arranged or disposed on the interlayer insulating layer 117. The third conductive layer may include a conductive material including molybdenum (Mo), aluminum (Al), copper (Cu), titanium (Ti), or the like, and may be formed as a multi-layer or single-layer structure including the above material. For example, the third conductive layer may have a Ti/Al/Ti multi-layer structure.

The third conductive layer may include a first electrode E1. The first electrode E1 may be electrically connected to the drain region D of the semiconductor layer A via a contact hole formed in the first gate insulating layer 113, the second gate insulating layer 115, and the interlayer insulating layer 117. While the first electrode E1 is illustrated as being electrically connected to the drain region D of the semiconductor layer A in FIGS. 5 and 6, according to an embodiment, the first electrode E1 may be electrically connected to the source region S of the semiconductor layer A.

The third conductive layer may be covered or overlapped by an inorganic protective layer (not shown). The inorganic protective layer may include a single layer or multiple layers including silicon nitride (SiN$_x$) or silicon oxide (SiO$_x$). The inorganic protective layer may be introduced to cover or overlap and protect some or a part of wirings arranged or disposed on the inter layer insulating layer 117.

A planarization layer 119 is arranged or disposed to cover or overlap the third conductive layer, and the planarization layer 119 may include contact holes used to electrically connect the transistor TFT and a pixel electrode 210 to each other.

The planarization layer 119 may include an organic material layer provided as a single layer or multiple layers, and provide a flat upper surface. The planarization layer 119 may include a general-purpose polymer such as benzocyclobutene (BCB), PI, hexamethyldisiloxane (HMIDSO), polymethylmethacrylate (PMMA) or polystyrene (PS), a polymer derivative having a phenolic group, an acrylic polymer, an imide-based polymers, an aryl ether-based polymer, an amide-based polymer, a fluorine-based polymer, a p-xylene-based polymer, a vinyl alcohol-based polymer, and blends thereof.

According to an embodiment, as illustrated in FIGS. 5 and 6, the planarization layer 119 may include a first planarization layer 119$a$, a second planarization layer 119$b$, and a third planarization layer 119$c$.

A fourth conductive layer may be arranged or disposed on the first planarization layer 119$a$. The fourth conductive layer may include a TCO. For example, the fourth conductive layer may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

The fourth conductive layer may include the first connection line CL1. FIGS. 5 and 6 illustrate, as an example, the 1-1$^{st}$ connection line CL1$a$ and the 1-2$^{nd}$ connection line CL1$b$ from among the first connection lines CL1.

According to an embodiment, as illustrated in FIG. 5, the first connection line CL1 may be electrically connected to the first main conductive line MCL1 and/or the first auxiliary conductive line ACL1 via first contact holes formed in the second gate insulating layer 115, the interlayer insulating layer 117, and the first planarization layer 119$a$. Portions of the first connection line CL1 may be respectively buried in the first contact holes, and the portions of the first connection line CL1 respectively buried in the first contact holes may be referred to as the first contact plugs CP1 (FIG. 4). In other words, the first connection line CL1 and the first contact plug CP1 may be integrated.

For example, a 1-1$^{st}$ contact hole CNT1$a$, a 1-2$^{nd}$ contact hole CNT1$b$, a 1-3$^{rd}$ contact hole CNT1$c$, and a 1-4$^{th}$ contact hole CNT1*d* may be formed in the second gate insulating layer 115, the interlayer insulating layer 117, and the first planarization layer 119*a*.

Portions of the 1-1$^{st}$ connection line CL1*a* may be respectively buried in the 1-1$^{st}$ contact hole CNT1*a* and the 1-2$^{nd}$ contact hole CNT1*b*. The portion of the 1-1$^{st}$ connection line CL1*a* buried in the 1-1$^{st}$ contact hole CNT1*a* may be referred to as the 1-1$^{st}$ contact plug CP1*a*, and the portion of the 1-1$^{st}$ connection line CL1*a* buried in the 1-2$^{nd}$ contact hole CNT1*b* may be referred to as the 1-2$^{nd}$ contact plug CP1*b*. The 1-1$^{st}$ connection line CL1*a*, the 1-1$^{st}$ contact plug CP1*a*, and the 1-2$^{nd}$ contact plug CP1*b* may be integrated.

Portions of the 1-2$^{nd}$ connection line CL1*b* may be respectively buried in the 1-3$^{rd}$ contact hole CNT1*c* and the 1-4$^{th}$ contact hole CNT1*d*. A portion of the 1-2$^{nd}$ connection line CL1*b* buried in the 1-3$^{rd}$ contact hole CNT1*c* may be referred to as the 1-3$^{rd}$ contact plug CP1*c*, and a portion of the 1-2$^{nd}$ connection line CL1*b* buried in the 1-4$^{th}$ contact hole CNT1*d* may be referred to as the 1-4$^{th}$ contact plug CP1*d*. The 1-2$^{nd}$ connection line CL1*b*, the 1-3$^{rd}$ contact plug CP1*c*, and the 1-4$^{th}$ contact plug CP1*d* may be integrated.

As a result, the 1-1$^{st}$ connection line CL1*a* may be electrically connected to the first main conductive line MCL1 via the 1-1$^{st}$ contact plug CP1*a*, and electrically connected to the 1-1$^{st}$ auxiliary conductive line ACL1*a* via the 1-2$^{nd}$ contact plug CP1*b*. The 1-2$^{nd}$ connection line CL1*b* may be electrically connected to the 1-1$^{st}$ auxiliary conductive line ACL1*a* via the 1-3$^{rd}$ contact plug CP1*c*, and electrically connected to the 1-2$^{nd}$ auxiliary conductive line ACL1*b* via the 1-4$^{th}$ contact plug CP1*d*.

As illustrated in FIG. 6, in case that the first main conductive line MCL1 and the first auxiliary conductive line ACL1 are arranged or disposed on the second gate insulating layer 115, the first contact holes may be formed in the interlayer insulating layer 117 and the first planarization layer 119*a*.

A fifth conductive layer may be arranged or disposed on the second planarization layer 119*b*. The fifth conductive layer may include a conductive material including molybdenum (Mo), aluminum (Al), copper (Cu), titanium (Ti), or the like, and may be formed as a multi-layer or single-layer structure including the above material.

The fifth conductive layer may include a second electrode E2. The second electrode E2 may be electrically connected to the first electrode E1 via a contact hole formed in the first planarization layer 119*a* and the second planarization layer 119*b*.

A display element DE may be arranged or disposed on the planarization layer 119. The display element DE may include the pixel electrode 210, an intermediate layer 220 including an organic emission layer, and an opposite electrode 230. For example, the display element DE may include an organic light-emitting diode.

The display element DE may be electrically connected to the transistor TFT via the contact holes formed in the planarization layer 119 and the second electrode E2. Accordingly, the display element DE may be electrically connected to the pixel circuit PC.

The pixel electrode 210 may include a (semi)transmissive electrode or a reflective electrode. In an embodiment, the pixel electrode 210 may include a reflective layer including Ag, Mg, Al, Pt, Pd, Au, Ni, Nd, Ir, Cr, and compounds thereof, and a transparent or semitransparent electrode layer formed on the reflective layer. The transparent or semitransparent electrode layer may include at least one from among indium tin oxide (ITO), indium zinc oxide (IZO), zinc oxide (ZnO), indium oxide (In$_2$O$_3$), indium gallium oxide (IGO), and aluminum zinc oxide (AZO). In an embodiment, the pixel electrode 210 may have an ITO/Ag/ITO structure.

In a display area of the substrate 100, a pixel defining layer 121 may be arranged or disposed on the planarization layer 119. The pixel defining layer 121 may cover or overlap edges of the pixel electrode 210 and have an opening exposing a center portion of the pixel electrode 210. A light-emitting area of the display element DE may be defined by the opening.

The pixel defining layer 121 may increase a distance between the edges of the pixel electrode 210 and the opposite electrode 230 above the pixel electrode 210 to thereby perform a function of preventing an arc or the like at the edges of the pixel electrode 210.

The pixel defining layer 121 may include at least one organic insulating material from among PI, polyamide, acrylic resin, BCB, HMDSO, and phenolic resin, and may be formed using a method such as spin coating.

The intermediate layer 220 may be arranged or disposed in the opening formed by the pixel defining layer 121 and may include an organic emission layer. The organic emission layer may include an organic material including a fluorescent or phosphorescent material emitting red, green, blue, or white light. The organic emission layer may be a low molecular weight organic material or a polymer organic material, and a functional layer such as a hole transport layer (HTL), a hole injection layer (HIL), an electron transport layer (ETL), or an electron injection layer (EIL) may be selectively further arranged or disposed below and above the organic emission layer.

The opposite electrode 230 may include a transmissive electrode or a reflective electrode. In an embodiment, the opposite electrode 230 may include a transparent or semi-transparent electrode, and may include a metal thin-film including Li, Ca, LiF/Ca, LiF/Al, Al, Ag, Mg, or a compound thereof and having a small work function. Also, a TCO layer such as ITO, IZO, ZnO or In$_2$O$_3$ may be further arranged or disposed on the metal thin-film. The opposite electrode 230 may be arranged or disposed over the display area, and arranged or disposed on the intermediate layer 220 and the pixel defining layer 121. The opposite electrode 230 may be integral with respect to display elements DE to correspond to pixel electrodes 210.

The display element DE as described above may be easily damaged by external moisture or oxygen, and thus may be covered or overlapped using an encapsulation layer (not shown) to be protected. The encapsulation layer may cover or overlap the display area and extend to at least a portion of a peripheral area. The encapsulation layer may include a first inorganic encapsulation layer, an organic encapsulation layer, and a second inorganic encapsulation layer.

Figure 7:
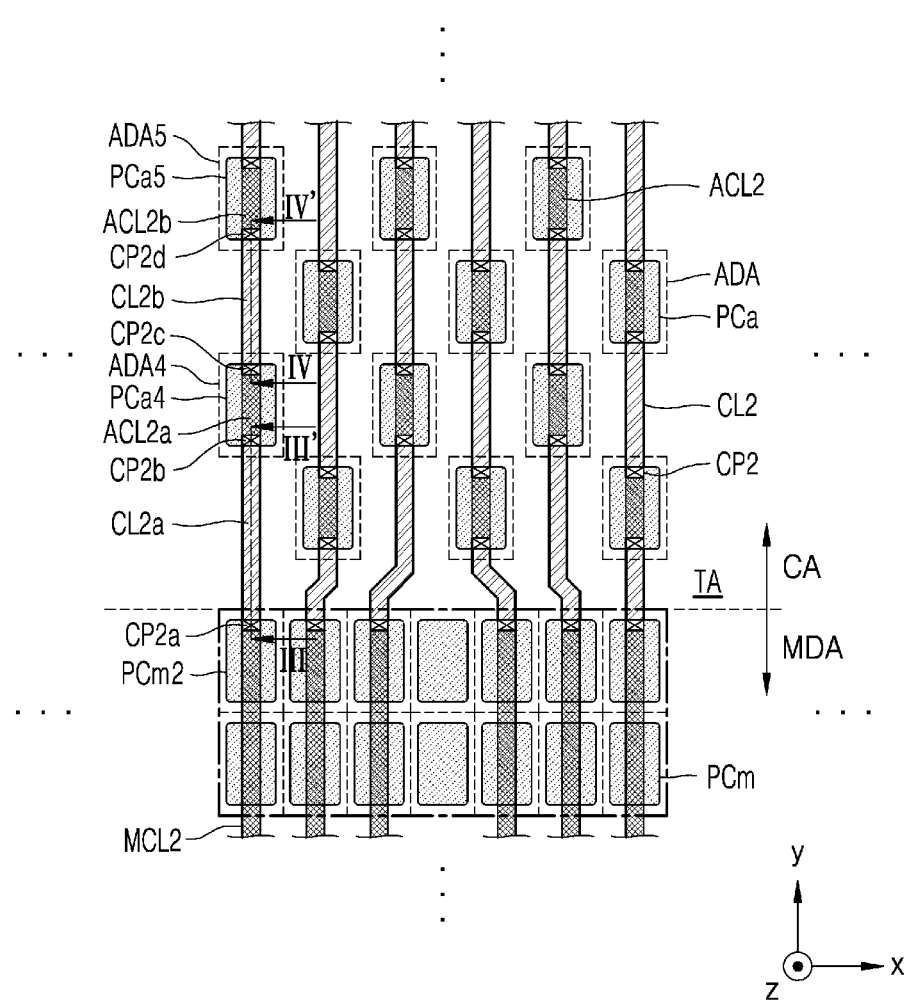
FIG. 7 is a schematic enlarged plan view of a portion of a display apparatus according to an embodiment.

FIG. 7 is a schematic enlarged plan view of a region of a display apparatus according to an embodiment.

Referring to FIG. 7, the main pixel circuits PCm and the second main conductive lines MCL2 respectively constituting the main pixels PXm (FIG. 3) may be arranged or disposed in the main display area MDA.

The second main conductive lines MCL2 may be respectively electrically connected to the main pixel circuits PCm located or disposed in same columns. The second main conductive lines MCL2 may be electrically connected to a pad or a voltage wiring arranged or disposed in the peripheral area PA (FIG. 1). The second main conductive lines MCL2 may respectively transfer an electrical signal to the main pixel circuits PCm located or disposed in same columns.

For example, as illustrated in FIG. 7, a second main pixel circuit PCm2 which is one of the main pixel circuits PCm may be electrically connected to the second main conductive line MCL2 extending in the second direction (for example, ±y direction).

While each of the second main conductive lines MCL2 is illustrated as a single wiring in FIG. 7, the second main conductive lines MCL2 may each include wirings. For example, each of the second main conductive lines MCL2 may include a main data line, a main driving voltage line, or the like within the spirit and the scope of the disclosure. This will be described in further detail later with reference to FIG. 11.

The auxiliary pixel circuits PCa, second auxiliary conductive lines ACL2, and second connection lines CL2 respectively constituting the auxiliary pixels PXa (FIG. 3) may be arranged or disposed in the component area CA.

The second auxiliary conductive lines ACL2 may respectively extend in the second direction (for example, ±y direction) to be electrically connected to the auxiliary pixel circuits PCa.

For example, as illustrated in FIG. 7, a fourth auxiliary pixel circuit PCa4, which is one of the auxiliary pixel circuits PCa, may be electrically connected to a 2-$1^{st}$ auxiliary conductive line ACL2a extending in the second direction (for example, ±y direction), and a fifth auxiliary pixel circuit PCa5, which another one of the auxiliary pixel circuits PCa, may be electrically connected to a 2-$2^{nd}$ auxiliary conductive line ACL2b extending in the second direction (for example, ±y direction).

The auxiliary display area ADA, in which the fourth auxiliary pixel circuit PCa4 is arranged or disposed, from among the auxiliary display areas ADA, may be referred to as a fourth auxiliary display area ADA4, and the auxiliary display areas ADA, in which the fifth auxiliary pixel circuit PCa5 is arranged or disposed, from among the auxiliary display areas ADA, may be referred to as a fifth auxiliary display area ADA5.

While each of the second auxiliary conductive lines ACL2 is illustrated as a single wiring in FIG. 7, each of the second auxiliary conductive lines ACL2 may include wirings. For example, each of the second auxiliary conductive lines ACL2 may include an auxiliary data line, an auxiliary driving voltage line, or the like within the spirit and the scope of the disclosure. As each of the second auxiliary conductive lines ACL2 may include wirings, each of the second connection lines CL2 may also include wirings. This will be described in further detail later with reference to FIG. 11.

Each of the second connection lines CL2 may extend in the second direction (for example, ±y direction) to electrically connect the second main conductive line MCL2 to the second auxiliary conductive line ACL2 or electrically connect the second auxiliary conductive lines ACL2 electrically connected to different auxiliary pixel circuits PCa to one another.

In other words, some or a part of the second connection lines CL2 may electrically connect the second main conductive line MCL2 to the second auxiliary conductive line ACL2. Some others of the second connection lines CL2 may electrically connect the second auxiliary conductive lines ACL2 electrically connected to different auxiliary pixel circuits PCa, to one another.

For example, as illustrated in FIG. 7, a 2-$1^{st}$ connection line CL2a, which is one of the second connection lines CL2, may electrically connect the second main conductive line MCL2 to the 2-$1^{st}$ auxiliary conductive line ACL2a. A 2-$2^{nd}$ connection line CL2b, which is another one of the second connection lines CL2, may electrically connect the 2-$1^{st}$ auxiliary conductive line ACL2a to the 2-$2^{nd}$ auxiliary conductive line ACL2b.

The second main conductive line MCL2 and the second auxiliary conductive line ACL2 that are electrically connected to each other via the second connection line CL2, from among the second main conductive lines MCL2 and the second auxiliary conductive lines ACL2, may be apart from each other in the second direction (for example, ±y direction). The second auxiliary conductive lines ACL2 electrically connected to each other via the second connection line CL2, from among the second auxiliary conductive lines ACL2, may be apart from each other in the second direction (for example, ±y direction). The transmission area TA may be between the second main conductive line MCL2 and the second auxiliary conductive line ACL2 that are apart from each other in the second direction (for example, ±y direction). The transmission area TA may be arranged or disposed between the second auxiliary conductive lines ACL2 that are apart from each other in the second direction (for example, ±y direction).

For example, as shown in FIG. 7, the second main conductive line MCL2 and the 2-$1^{st}$ auxiliary conductive line ACL2a, and the 2-$1^{st}$ auxiliary conductive line ACL2a and the 2-$2^{nd}$ auxiliary conductive line ACL2b may be each spaced apart from each other in the second direction (for example, ±y direction). The transmission area TA may be between the second main conductive line MCL2 and the 2-$1^{st}$ auxiliary conductive line ACL2a and between the 2-$1^{st}$ auxiliary conductive line ACL2a the 2-$2^{nd}$ auxiliary conductive line ACL2b.

As described above, in case that the second main conductive line MCL2 and the second auxiliary conductive line ACL2 that are apart from each other in the second direction (for example, ±y direction) are electrically connected to each other via the second connection line CL2, and the second auxiliary conductive lines ACL2 that are apart from each other in the second direction (for example, ±y direction) are electrically connected to each other via the second connection line CL, an electrical signal supplied a pad or a voltage wiring may be transferred to each of the main pixel circuits PCm and the auxiliary pixel circuits PCa arranged or disposed in the second direction (for example, ±y direction).

As illustrated in FIG. 1, the main display area MDA may surround the component area CA. The second main conductive lines MCL2 that are apart from each other by the component area CA in the second direction (for example, ±y direction) may be electrically connected to each other via the second connection lines CL2 and the second auxiliary conductive lines ACL2.

According to an embodiment, the second connection line CL2 and the second main conductive line MCL2 may be electrically connected to each other via a second contact plug CP2. The second connection line CL2 and the second auxiliary conductive line ACL2 may be electrically connected to each other via the second contact plug CP2.

For example, as illustrated in FIG. 7, the 2-$1^{st}$ connection line CL2a and the second main conductive line MCL2 may be electrically connected to each other via a 2-$1^{st}$ contact plug CP2a, and the 2-$1^{st}$ connection line CL2a and the 2-$1^{st}$ auxiliary conductive line ACL2a may be electrically connected to each other via a 2-$2^{nd}$ contact plug CP2b. The 2-$2^{nd}$ connection line CL2b and the 2-$1^{st}$ auxiliary conductive line ACL2a may be electrically connected to each other via a 2-$3^{rd}$ contact plug CP2c, and the 2-$2^{nd}$ connection line CL2b and the 2-2$^{nd}$ auxiliary conductive line ACL2b may be electrically connected to each other via a 2-4$^{th}$ contact plug CP2d.

Figure 8:
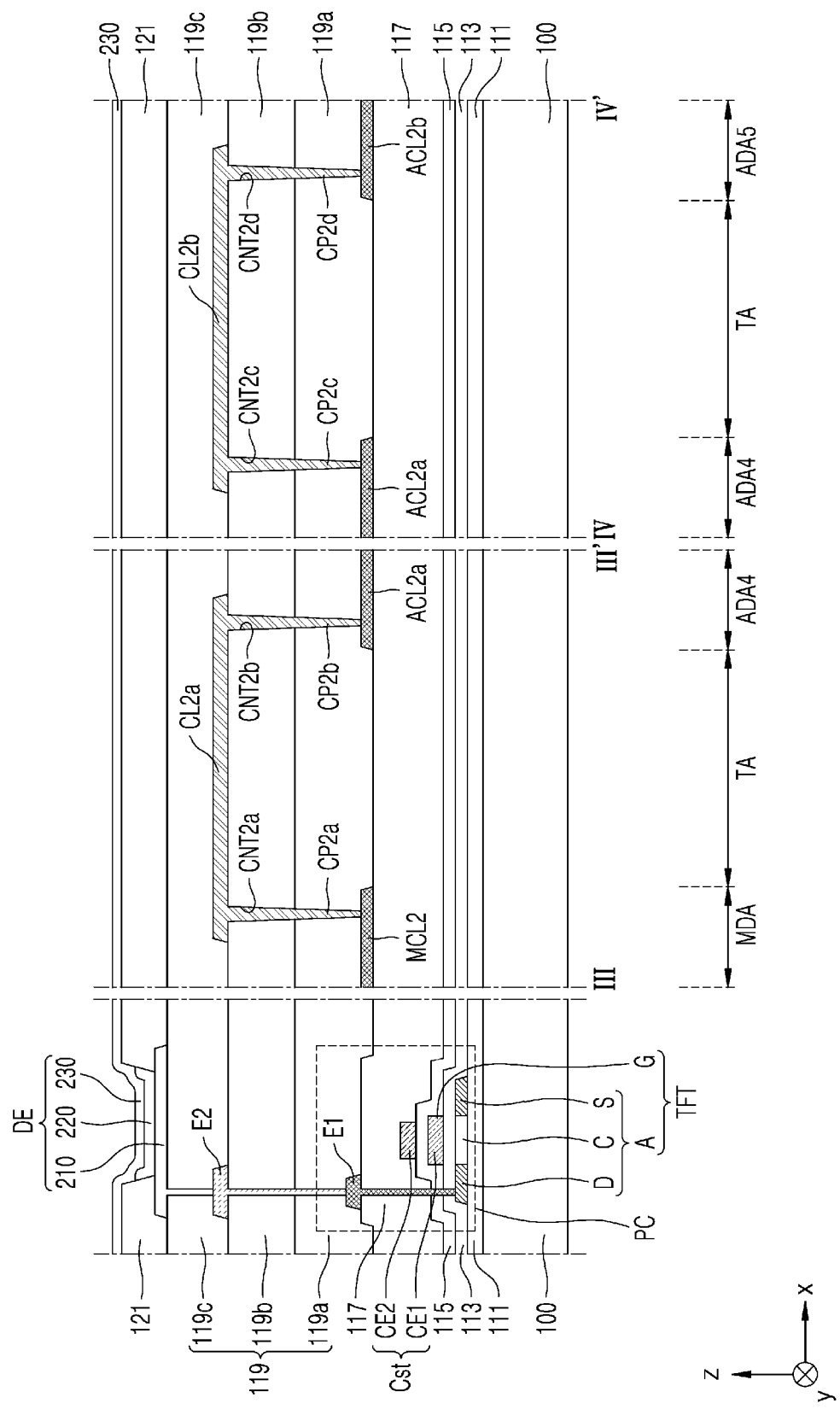
FIG. 8 is a schematic cross-sectional view of a portion of FIG. 7 taken along line and line IV-IV'.

As illustrated in FIG. 8 to be described later, a portion of the second connection line CL2 may be buried in a contact hole formed in an insulating layer. The portion of the second connection line CL2 buried in the contact hole may be referred to as the second contact plug CP2. In other words, the second connection line CL2 and the second contact plug CP2 may be a single body.

Figure 9:
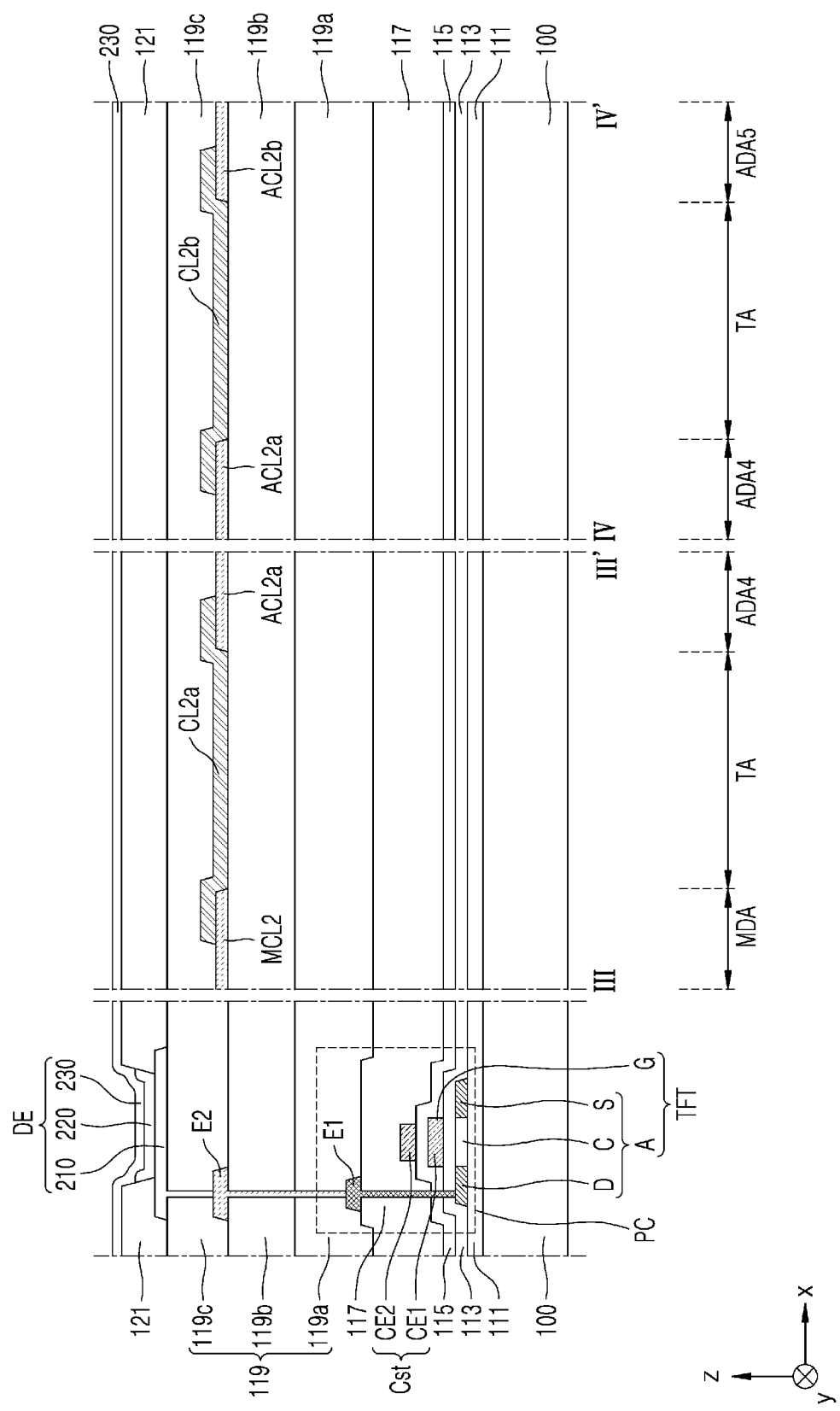
FIG. 9 is a schematic cross-sectional view of a portion of FIG. 7 taken along line and line IV-IV'.

As illustrated in FIG. 9 to be described later, in case that the second main conductive line MCL2, the second auxiliary conductive line ACL2, and the second connection line CL2 are arranged or disposed in a same layer, the second contact plug CP2 may be omitted.

According to an embodiment, the second connection line CL2 may include a TCO. For example, the second connection line CL2 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

According to an embodiment, as illustrated in FIG. 7, each of the second connection lines CL2 may at least partially overlap the transmission area TA. As described above, the second connection line CL2 may include a transparent conductive material having high transmittance, and thus, even in case that the second connection line CL2 is arranged or disposed to at least partially overlap the transmission area TA, transmittance of the transmission area TA may be ensured.

FIG. 8 is a schematic cross-sectional view of a portion of FIG. 7 taken along line III-III' and line IV-IV'. In FIG. 8, like reference numerals as those of FIGS. 5 and 6 denote like elements, and thus, repeated description thereof will be omitted.

Referring to FIG. 8, the third conductive layer may include the first electrode E1, the second main conductive line MCL2, and the second auxiliary conductive line ACL2 (FIG. 7). In other words, the first electrode E1, the second main conductive line MCL2, and the second auxiliary conductive line ACL2 may be arranged or disposed on an upper surface of the interlayer insulating layer 117. FIG. 8 illustrates, as an example, the 2-1$^{st}$ auxiliary conductive line ACL2a and the 2-2$^{nd}$ auxiliary conductive line ACL2b from among the second auxiliary conductive lines ACL2.

A sixth conductive layer may be further arranged or disposed on the second planarization layer 119b. The sixth conductive layer may include a TCO. For example, the sixth conductive layer may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

The sixth conductive layer may include the second connection line CL2. FIG. 8 illustrates, as an example, the 2-1$^{st}$ connection line CL2a and the 2-2$^{nd}$ connection line CL2b from among the second connection lines CL2.

The second connection line CL2 may be electrically connected to the second main conductive line MCL2 and/or the second auxiliary conductive line ACL2 via second contact holes formed in the first planarization layer 119a and the second planarization layer 119b. Portions of the second connection line CL2 may be respectively buried in the second contact holes, and the portions of the second connection line CL2 respectively buried in the second contact holes may be referred to as the second contact plugs CP2 (FIG. 7). In other words, the second connection line CL2 and the second contact plug CP2 may be integrated.

For example, a 2-1$^{st}$ contact hole CNT2a, a 2-2$^{nd}$ contact hole CNT2b, a 2-3$^{rd}$ contact hole CNT2c, and a 2-4$^{th}$ contact hole CNT2d may be formed in the first planarization layer 119a and the second planarization layer 119b.

Portions of the 2-1$^{st}$ connection line CL2a may be respectively buried in the 2-1$^{st}$ contact hole CNT2a and the 2-2$^{nd}$ contact hole CNT2b. A portion of the 2-1$^{st}$ connection line CL2a buried in the 2-1$^{st}$ contact hole CNT2a may be referred to as the 2-1$^{st}$ contact plug CP2a, and a portion of the 2-1$^{st}$ connection line CL2a buried in the 2-2$^{nd}$ contact hole CNT2b may be referred to as the 2-2$^{nd}$ contact plug CP2b. The 2-1$^{st}$ connection line CL2a, the 2-1$^{st}$ contact plug CP2a, and the 2-2$^{nd}$ contact plug CP2b may be integrated.

A portion of the 2-2$^{nd}$ connection line CL2b may be buried in each of the 2-3$^{rd}$ contact hole CNT2c and the 2-4$^{th}$ contact hole CNT2d. The portion of the 2-2$^{nd}$ connection line CL2b buried in the 2-3$^{rd}$ contact hole CNT2c may be referred to as the 2-3$^{rd}$ contact plug CP2c, and the portion of the 2-2$^{nd}$ connection line CL2b buried in the 2-4$^{th}$ contact hole CNT2d may be referred to as the 2-4$^{th}$ contact plug CP2d. The 2-2$^{nd}$ connection line CL2b, the 2-3$^{rd}$ contact plug CP2c, and the 2-4$^{th}$ contact plug CP2d may be integrated.

As a result, the 2-1$^{st}$ connection line CL2a may be electrically connected to the second main conductive line MCL2 via the 2-1$^{st}$ contact plug CP2a, and electrically connected to the 2-1$^{st}$ auxiliary conductive line ACL2a via the 2-2$^{nd}$ contact plug CP2b. The 2-2$^{nd}$ connection line CL2b may be electrically connected to the 2-1$^{st}$ auxiliary conductive line ACL2a via the 2-3$^{rd}$ contact plug CP2c, and electrically connected to the 2-2$^{nd}$ auxiliary conductive line ACL2b via the 2-4$^{th}$ contact plug CP2d.

FIG. 9 is a schematic cross-sectional view of a portion of FIG. 7 taken along line III-III' and line IV-IV'. FIG. 9 is a modified embodiment of FIG. 8, and is different in structures of the second main conductive line MCL2 and the second auxiliary conductive line ACL2. Hereinafter, repeated details may be referred to the description with reference to FIG. 8, and description will focus on the difference.

Referring to FIG. 9, unlike FIG. 8, the second main conductive lines MCL2 and the second auxiliary conductive line ACL (FIG. 7) may be arranged or disposed in a same layer as the second connection line CL2 (FIG. 7). However, a material included in the second connection line CL2 may be different from materials respectively included in the second main conductive line MCL2 and the second auxiliary conductive line ACL2.

As described above with reference to FIG. 5, the fifth conductive layer may be arranged or disposed on the second planarization layer 119b, and the fifth conductive layer may include a conductive material including molybdenum (Mo), aluminum (Al), copper (Cu), titanium (Ti), or the like, and may include a single-layer or multi-layer structure including the above material. The fifth conductive layer may include the second main conductive line MCL2 and the second auxiliary conductive line ACL2.

As described above with reference to FIG. 8, the sixth conductive layer may be further arranged or disposed on the second planarization layer 119b. The sixth conductive layer may include a TCO. For example, the sixth conductive layer may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). The sixth conductive layer may include the second connection line CL2.

According to an embodiment, an end of the second connection line CL2 may cover or overlap an end of the second main conductive line MCL2, and the other end of the second connection line CL2 may cover or overlap an end of the second auxiliary conductive line ACL2.

For example, as illustrated in FIG. 9, an end of the 2-1$^{st}$ connection line CL2a may cover or overlap the end of the second main conductive line MCL2, and the other end of the 2-1$^{st}$ connection line CL2a may cover or overlap an end of the 2-1$^{st}$ auxiliary conductive line ACL2a. An end of the 2-2$^{nd}$ connection line CL2b may cover or overlap the end of the 2-1$^{st}$ auxiliary conductive line ACL2a, and the other end of the 2-2$^{nd}$ connection line CL2b may cover or overlap an end of the 2-2$^{nd}$ auxiliary conductive line ACL2b.

As described above, in case that the second main conductive line MCL2 and the second auxiliary conductive line ACL2 are arranged or disposed in a same layer as the second connection line CL2, the second contact plugs CP2 illustrated in FIGS. 7 and 8 may be omitted.

Figure 10:
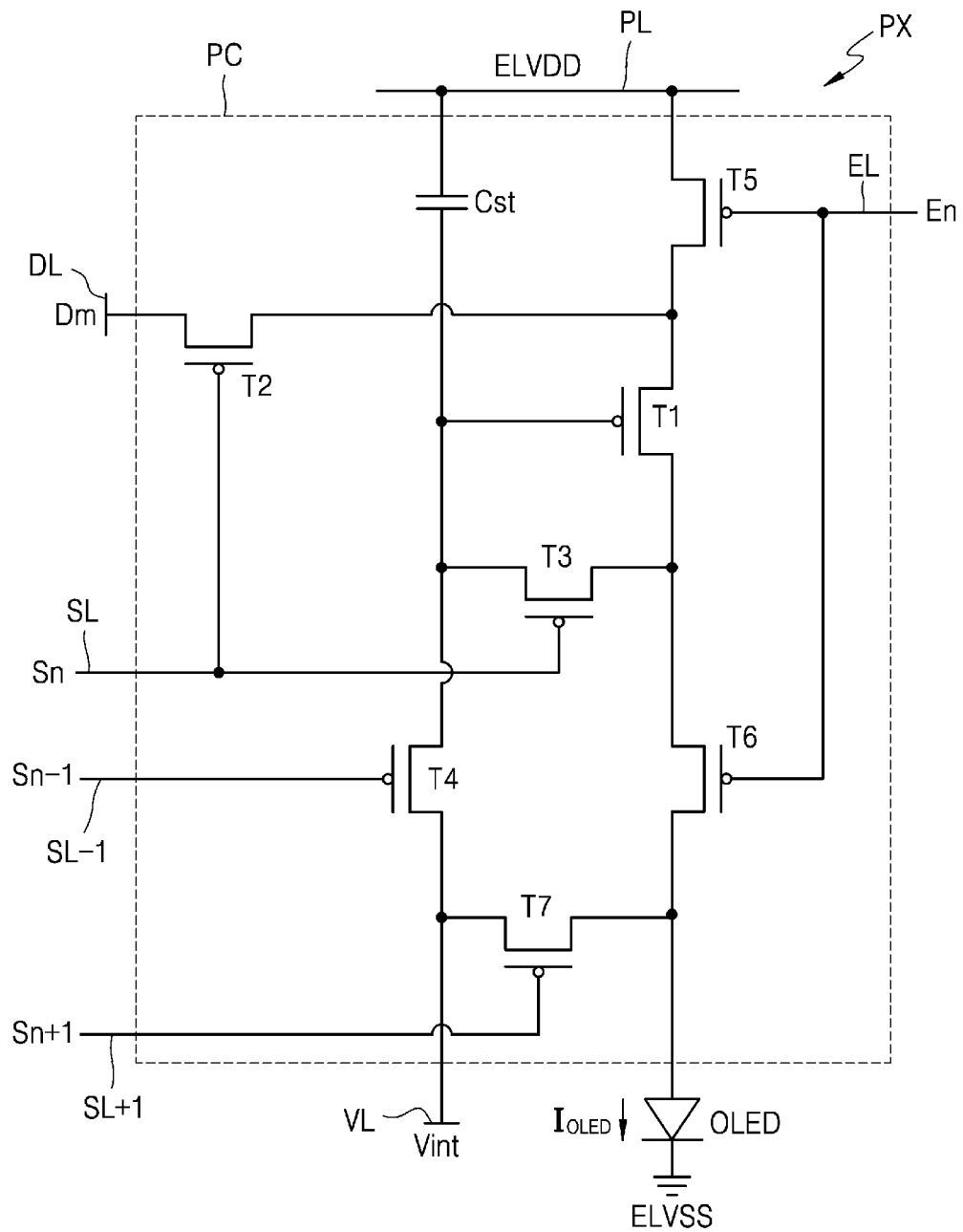
FIG. 10 is a schematic diagram of an equivalent circuit of a pixel according to an embodiment.

FIG. 10 is a schematic diagram of an equivalent circuit of a pixel according to an embodiment.

Referring to FIG. 10, a pixel PX may include a pixel circuit PC and an organic light-emitting diode OLED electrically connected to the pixel circuit PC.

For example, as illustrated in FIG. 10, the pixel circuit PC may include first through seventh transistors T1 through T7 and a storage capacitor Cst. The first to seventh transistors T1 through T7 and the storage capacitor Cst may be electrically connected to first through third scan lines SL, SL−1, and SL+1 respectively that transmit first through third scan signals Sn, Sn−1, and Sn+1, a data line DL to transmit a data voltage Dm, an emission control line EL to transmit an emission control signal En, and a driving voltage line PL to transmit a driving voltage ELVDD, an initialization voltage line VL to transmit an initialization voltage Vint, and a common electrode to which a common voltage ELVSS may be applied.

The first transistor T1 may include a driving transistor having a drain current, the amplitude of which is determined according to a gate-source voltage, and the second through seventh transistors T2 through T7 may include switching transistors turned on or off according to a gate-source voltage, substantially, a gate voltage. The first through seventh transistors T1 through T7 may include thin-film transistors.

The first transistor T1 may be referred to as a driving transistor, the second transistor T2 may be referred to as a scan transistor, the third transistor T3 may be referred to as a compensation transistor, and the fourth transistor T4 may be referred to as a gate initialization transistor, and the fifth transistor T5 may be referred to as a first emission control transistor, the sixth transistor T6 may be referred to as a second emission control transistor, and the seventh transistor T7 may be referred to as an anode initialization transistor.

The storage capacitor Cst may be electrically connected between the driving voltage line PL and a gate of the driving transistor T1. The storage capacitor Cst may have the upper electrode CE2 electrically connected to the driving voltage line PL and the lower electrode CE1 electrically connected to the gate of the driving transistor T1.

The driving transistor T1 may control amplitude of the driving current $I_{OLED}$ flowing from the driving voltage line PL to the organic light-emitting diode OLED according to a gate-source voltage. The driving transistor T1 may include the gate electrically connected to the lower electrode CE1 of the storage capacitor Cst, a source electrically connected to the driving voltage line PL via the first emission control transistor T5, and a drain electrically connected to the organic light-emitting diode OLED via the second emission control transistor T6.

The driving transistor T1 may output the driving current $I_{OLED}$ to the organic light-emitting diode OLED according to the gate-source voltage. The amplitude of the driving current $I_{OLED}$ may be determined based on a difference between the gate-source voltage and a threshold voltage of the driving transistor T1. The organic light-emitting diode OLED may receive the driving current $I_{OLED}$ from the driving transistor T1 and emit light at a brightness according to the amplitude of the driving current $I_{OLED}$.

The scan transistor T2 may transfer the data voltage Dm to the source of the driving transistor T1 in response to the first scan signal Sn. The scan transistor T2 may have a gate electrically connected to the first scan line SL, a source electrically connected to the data line DL, and a drain electrically connected to the source of the driving transistor T1.

The compensation transistor T3 may be electrically connected in series between the drain and the gate of the driving transistor T1, and electrically connect the drain and the gate of the driving transistor T1 to each other in response to the first scan signal Sn. The compensation transistor T3 may have a gate electrically connected to the first scan line SL, a source electrically connected to the drain of the driving transistor T1, and a drain electrically connected to the gate of the driving transistor T1. FIG. 10 illustrates that the compensation transistor T3 may include a single transistor, but the compensation transistor T3 may include two transistors electrically connected in series with each other.

The gate initialization transistor T4 may apply an initialization voltage Vint to the gate of the driving transistor T1 in response to the second scan signal Sn−1. The gate initialization transistor T4 may have a gate electrically connected to the second scan line SL−1, a source electrically connected to the gate of the driving transistor T1, and a drain electrically connected to the initialization voltage line VL. In FIG. 10, the gate initialization transistor T4 is illustrated to include a single transistor, but the gate initialization transistor T4 may include two transistors electrically connected in series with each other.

The anode initialization transistor T7 may apply the initialization voltage Vint to an anode of the organic light-emitting diode OLED in response to the third scan signal Sn+1. The anode initialization transistor T7 may have a gate electrically connected to the third scan line SL+1, a source electrically connected to the anode of the organic light-emitting diode OLED, and a drain electrically connected to the initialization voltage line VL.

The first emission control transistor T5 may electrically connect the driving voltage line PL and the source of the driving transistor T1 to each other in response to the emission control signal En. The first emission control transistor T5 may have a gate electrically connected to the emission control line EL, a source electrically connected to the driving voltage line PL, and a drain electrically connected to the source of the driving transistor T1.

The second emission control transistor T6 may electrically connect the drain of the driving transistor T1 and the anode of the organic light-emitting diode OLED to each other in response to the emission control signal En. The second emission control transistor T6 may have a gate electrically connected to the emission control line EL, a source electrically connected to the drain of the driving transistor T1, and a drain electrically connected to the anode of the organic light-emitting diode OLED.

The second scan signal Sn-1 may be substantially synchronized with the first scan signal Sn of a previous row. The third scan signal Sn+1 may be substantially synchronized with the first scan signal Sn. According to another example, the third scan signal Sn+1 may be substantially synchronized with the first scan signal Sn of a next row.

In an embodiment, the first through seventh transistors T1 through T7 may include a semiconductor layer including silicon. For example, the first through seventh transistors T1 through T7 may include a semiconductor layer including low-temperature polysilicon (LTPS). Polysilicon materials have high electron mobility (more than about 100 cm$^2$/Vs), and thus low energy consumption and excellent reliability. As another example, the semiconductor layers of the first through seventh transistors T1 through T7 may include an oxide of at least one material from among indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer A may include an InSnZnO (ITZO) semiconductor layer, an InGaZnO (IGZO) semiconductor layer, or the like within the spirit and the scope of the disclosure. As another example, some or a part of the semiconductor layers of the first through seventh transistors T1 through T7 may include LTPS, and some or a part of the semiconductor layers may include an oxide semiconductor (IGZO, etc.).

Hereinafter, a detailed operation process of a pixel PX of a display apparatus according to an embodiment will be described in detail. As illustrated in FIG. 5, it is assumed that the first through seventh transistors T1 through T7 are p-type metal-oxide-semiconductor field effect transistors (MOSFETs).

First, in case that an emission control signal En of a high level is received, the first emission control transistor T5 and the second emission control transistor T6 are turned off, and the driving transistor T1 stops outputting of a driving current $I_{OLED}$, and the organic light-emitting diode OLED stops emitting light.

Thereafter, during a gate initialization period in which the second scan signal Sn-1 of a low level is received, the gate initialization transistor T4 is turned on, and the initialization voltage Vint is applied to the gate of the driving transistor T1, for example, the lower electrode CE1 of the storage capacitor Cst. A difference between the driving voltage ELVDD and the initialization voltage Vint (ELVDD-Vint) may be stored in the storage capacitor Cst.

During a data write period in which the first scan signal Sn of a low level is received, the scan transistor T2 and the compensation transistor T3 are turned on, and the data voltage Dm is received by the source of the driving transistor T1. Here, the driving transistor T1 is diode-connected by the compensation transistor T3, and is biased in a forward direction. A gate voltage of the driving transistor T1 rises at the initialization voltage Vint. In case that the gate voltage of the driving transistor T1 is equal to a data compensation voltage Dm-|Vth| obtained by subtracting a threshold voltage Vth of the driving transistor T1 from the data voltage Dm, the driving transistor T1 is turned off, and the increase in the gate voltage of the driving transistor T1 is stopped. Accordingly, the difference between the driving voltage ELVDD and the data compensation voltage (Dm-|Vth|) (ELVDD-Dm+|Vth|) is stored in the storage capacitor Cst.

During an anode initialization period in which the third scan signal Sn+1 of a low level is received, the anode initialization transistor T7 is turned on, and the initialization voltage Vint is applied to the anode of the organic light-emitting diode OLED. By completely preventing light emission from the organic light-emitting diode OLED by applying the initialization voltage Vint to the anode of the organic light-emitting diode OLED, slight light emission from the organic light-emitting diode OLED occurring despite receiving the data voltage Dm corresponding to black gradation in a next frame may be prevented.

The first scan signal Sn and the third scan signal Sn+1 may be substantially synchronized with each other, and, the data write period and the anode initialization period may be the same period.

In case that the emission control signal En of a low level is received, the first emission control transistor T5 and the second emission control transistor T6 may be turned on, and the driving transistor T1 may output a driving current $I_{OLED}$ corresponding to a voltage obtained by subtracting the threshold voltage |Vth| of the driving transistor T1 from a source-gate voltage (ELVDD-Dm+|Vth|) of the driving transistor T1 stored in the storage capacitor Cst, and the organic light-emitting diode OLED may emit light at a luminance corresponding to the amplitude of the driving current $I_{OLED}$.

While FIG. 10 describes the pixel circuit PC including seven thin-film transistors and one storage capacitor, the disclosure is not limited thereto. For example, the pixel circuit PC may include two or more transistors and/or two or more storage capacitors. According to an embodiment, the pixel circuit PC may include two transistors and one storage capacitor.

Figure 11:
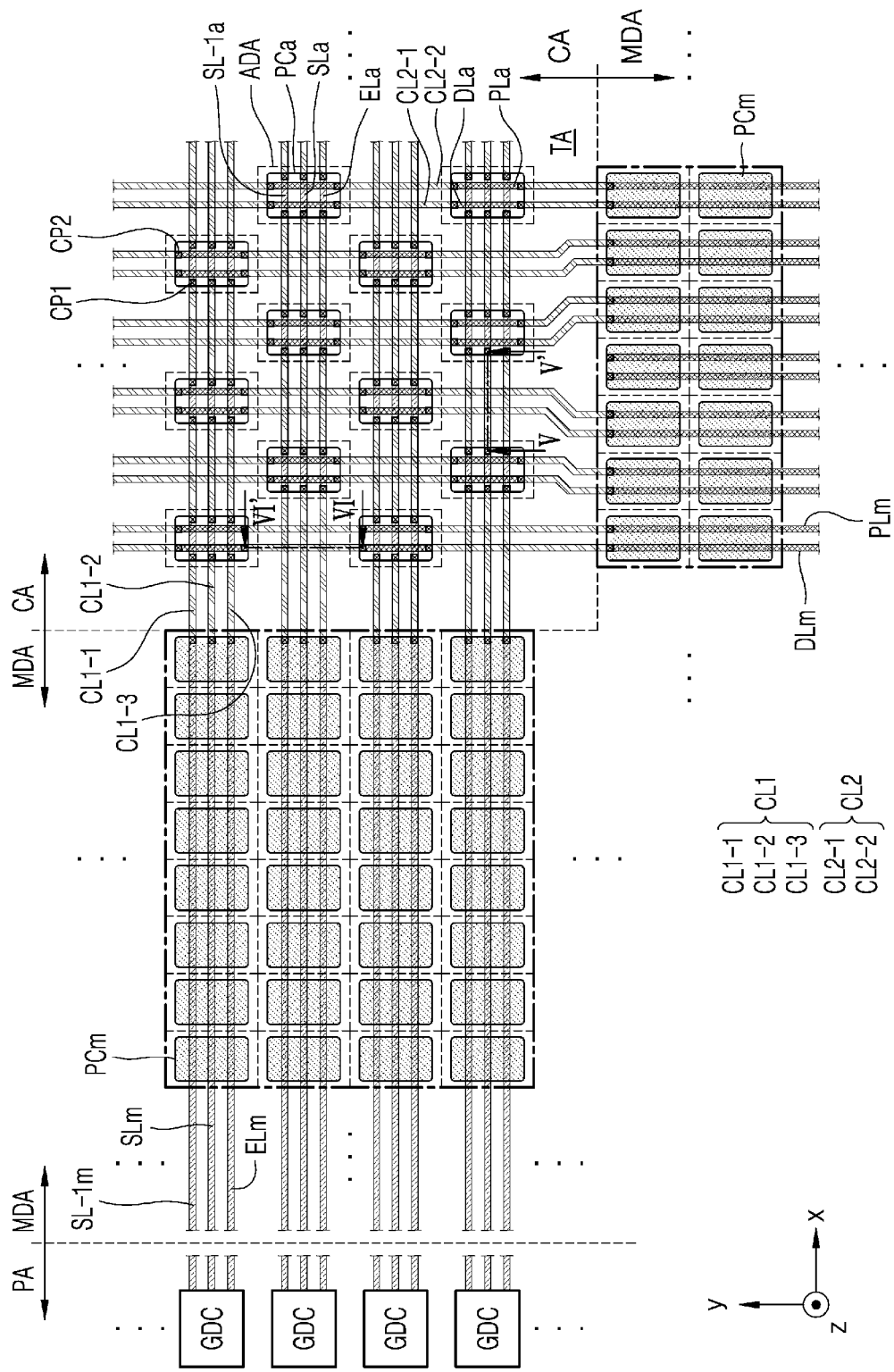
FIG. 11 is a schematic enlarged plan view of a portion of a display apparatus according to an embodiment.
Figure 12:
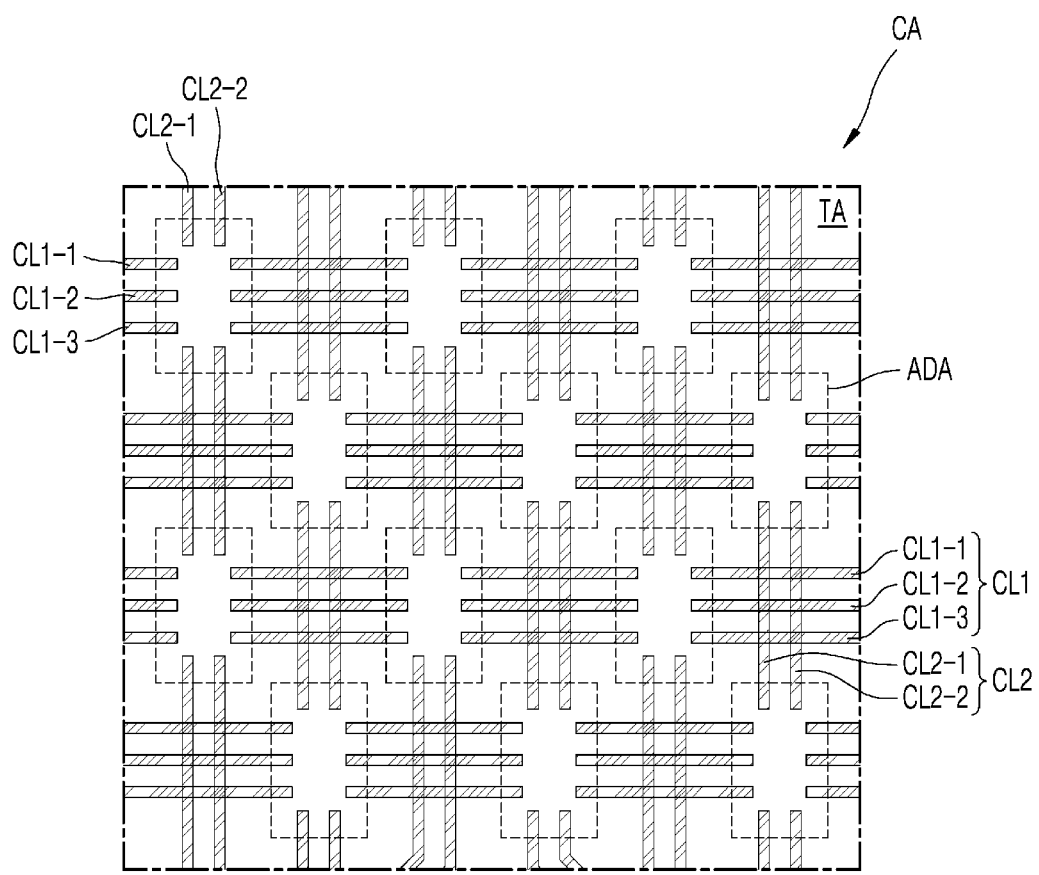
FIG. 12 is a schematic plan view of a connection line according to an embodiment.
Figure 13:
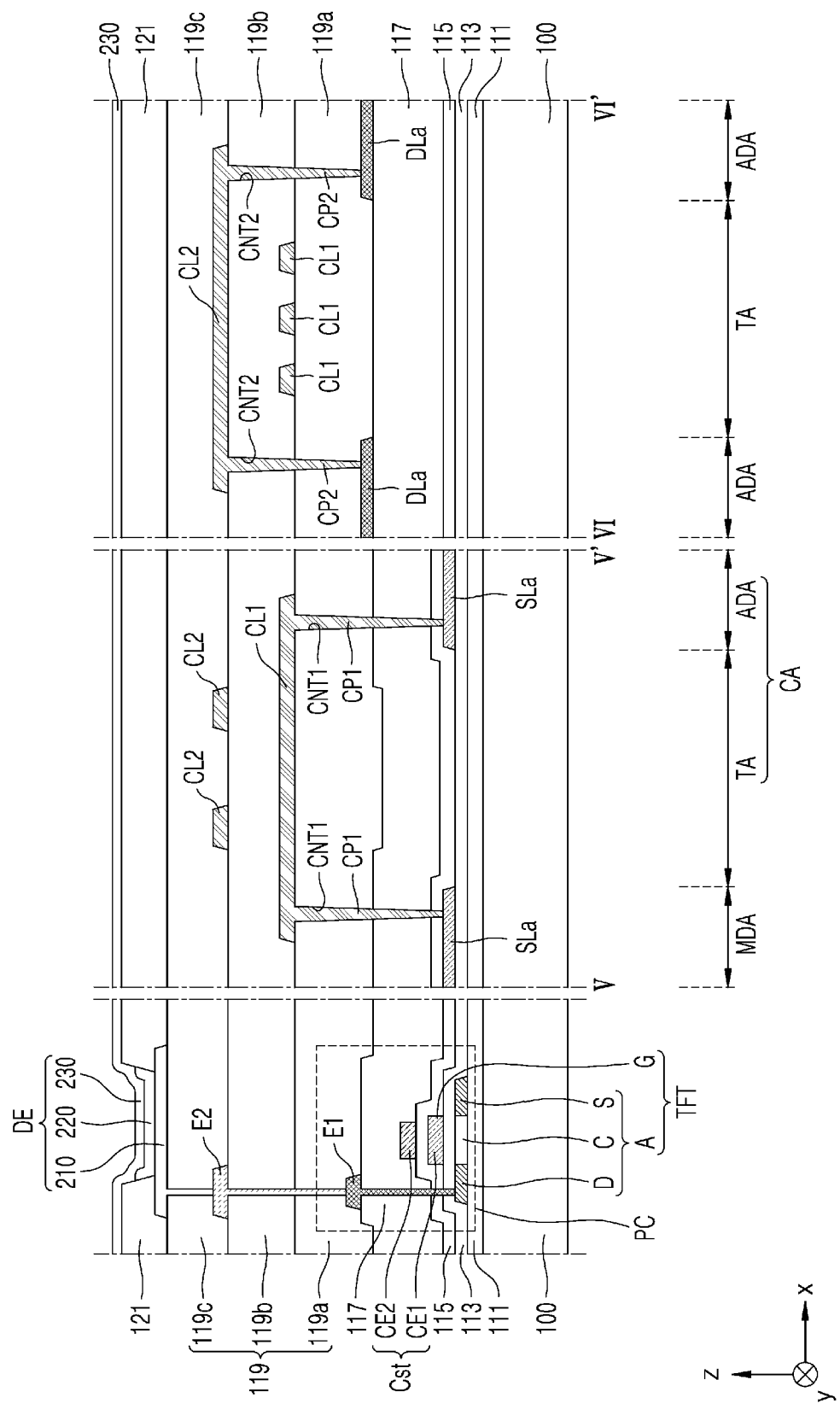
FIG. 13 is a schematic cross-sectional view of a portion of FIG. 11 taken along line V-V and line VI-VI'.

FIG. 11 is a schematic enlarged plan view of a portion of a display apparatus according to an embodiment. FIG. 12 is a schematic plan view of a first connection line and a second connection line according to an embodiment. FIG. 13 is a schematic cross-sectional view of a portion of FIG. 11 taken along line V-V' and line VI-VI'. FIG. 11 is a modified embodiment of FIGS. 4 and 7, and may be different from embodiments of FIGS. 4 and 7 in structures of a first main conductive line, a first connection line, a first auxiliary conductive line, a second main conductive line, a second connection line, and a second auxiliary conductive line. Hereinafter, repeated details may be referred to the description provided with reference to FIGS. 4 and 7, and description will focus on the difference.

Referring to FIG. 11, the main pixel circuit PCm arranged or disposed in the main display area MDA and the auxiliary pixel circuit PCa arranged or disposed in the auxiliary display area ADA may include the pixel circuit PC illustrated in FIG. 10.

Accordingly, the first main conductive line MCL1 illustrated in FIG. 4 may include a first main scan line SL-1m, a second main scan line SLm, and a main emission control line ELm. As a third main scan line may correspond to the first main scan line SL-1m or the first main scan line SL-1m in a next row, the third main scan line is omitted in FIG. 11. Each of the first main scan line SL-1m, the second main scan line SLm, and the main emission control line ELm may respectively extend in the first direction (for example, ±x direction) and be electrically connected to the main pixel circuits PCm located or disposed in a same row.

The first auxiliary conductive line ACL1 illustrated in FIG. 4 may include a first auxiliary scan line SL-1a, a second auxiliary scan line SLa, and an auxiliary emission control line ELa. As a third auxiliary scan line may correspond to the first auxiliary scan line SL-1a or the first auxiliary scan line SL-1a in a next row, the third auxiliary scan line is omitted in FIG. 11. The first auxiliary scan line SL-1a, the second auxiliary scan line SLa, and the auxiliary emission control line ELa may respectively extend in the first direction (for example, ±x direction) and be electrically connected to the auxiliary pixel circuit PCa.

The first connection line CL1 illustrated in FIG. 4 may include a 1-$1^{st}$ connection line CL1-1, a 1-$2^{nd}$ connection line CL1-2, and a 1-$3^{rd}$ connection line CL1-3. Each of the 1-$1^{st}$ connection lines CL1-1 may extend in the first direction (for example, ±x direction) to electrically connect the first main scan line SL-1$m$ to the first auxiliary scan line SL-1$a$ or electrically connect the first auxiliary scan lines SL-1$a$ electrically connected to different auxiliary pixel circuits PCa, to one another. Each of the 1-$2^{nd}$ electrically connection lines CL1-2 may extend in the first direction (for example, ±x direction) to electrically connect the second main scan line SLm to the second auxiliary scan line SLa or electrically connect the second auxiliary scan lines SLa electrically connected to different auxiliary pixel circuits PCa, to one another. Each of the 1-$3^{rd}$ connection lines CL1-3 may extend in the first direction (for example, ±x direction) to electrically connect the main emission control line ELm to the auxiliary emission control line ELa, and electrically connect the auxiliary emission control lines ELa electrically connected to different auxiliary pixel circuits PCa, to one another.

According to an embodiment, as illustrated in FIG. 12, the first connection lines CL1 may be apart from each other in the first direction (for example, ±x direction). In other words, a substantially planar shape of each of the first connection lines CL1 may be an island shape. The 1-$1^{st}$ connection lines CL1-1 may be apart from each other in the first direction (for example, ±x direction), and the 1-$2^{nd}$ connection lines CL1-2 may be apart from each other in the first direction (for example, ±x direction), and the 1-$3^{rd}$ connection lines CL1-3 may be apart from each other in the first direction (for example, ±x direction). In other words, a substantially planar shape of each of the 1-$1^{st}$ connection lines CL1-1, the 1-$2^{nd}$ connection lines CL1-2, and the 1-$3^{rd}$ connection lines CL1-3 be an island shape.

In FIG. 12, the first connection lines CL1 that are apart from each other in the first direction (for example, ±x direction) are illustrated, but in an embodiment, the first connection lines CL1 may continuously extend in the first direction (for example, ±x direction) in the component area CA. This will be described later in FIGS. 14 and 15.

According to an embodiment, the 1-$1^{st}$ connection line CL1-1 and the first main scan line SL-1$m$ may be electrically connected to each other via the first contact plug CP1, and the 1-$1^{st}$ connection line CL-1 and the first auxiliary scan line SL-1$a$ may be electrically connected to each other via the first contact plug CP1. The 1-$2^{nd}$ connection line CL1-2 and the second main scan line SLm may be electrically connected to each other via the first contact plug CP1, and the 1-$2^{nd}$ connection line CL1-2 and the second auxiliary scan line SLa may be electrically connected to each other via the first contact plug CP1. The 1-$3^{rd}$ connection line CL1-3 and the main emission control line ELm may be electrically connected to each other via the first contact plug CP1, and the 1-$3^{rd}$ connection line CL1-3 and the auxiliary emission control line ELa may be electrically connected to each other via the first contact plug CP1.

As illustrated in FIG. 13, first contact holes CNT1 may be formed in the second gate insulating layer 115, the interlayer insulating layer 117, and the first planarization layer 119$a$. Portions of the first connection line CL1 may be respectively buried in the first contact holes CNT1. The portions of the first connection lines CL1 respectively buried in the first contact holes CNT1 may be referred to as the first contact plugs CP1. The first connection line CL1 and the first contact plugs CP1 may be integrated.

The second main conductive line MCL2 illustrated in FIG. 7 may include a main data line DLm and a main driving voltage line PLm. The main data line DLm and the main driving voltage line PLm may respectively extend in the second direction (for example, ±y direction) to be electrically connected to the main pixel circuits PCm located or disposed in a same column.

The second auxiliary conductive line ACL2 illustrated in FIG. 7 may include an auxiliary data line DLa and an auxiliary driving voltage line PLa. The auxiliary data line DLa and the auxiliary driving voltage line PLa may respectively extend in the second direction (for example, ±y direction) to be electrically connected to the auxiliary pixel circuit PCa.

The second connection line CL2 illustrated in FIG. 7 may include a 2-$1^{st}$ connection line CL2-1 and a 2-$2^{nd}$ connection line CL2-2. The 2-$1^{st}$ connection lines CL2-1 may respectively extend in the second direction (for example, ±y direction) to electrically connect the main data line DLm to the auxiliary data line DLa, and connect the auxiliary data lines DLa electrically connected to different auxiliary pixel circuits PCa to one another. The 2-$2^{nd}$ connection lines CL2-2 may respectively extend in the second direction (for example, ±y direction) to electrically connect the main driving voltage line PLm to the auxiliary driving voltage line PLa, and electrically connect the auxiliary driving voltage lines PLa electrically connected to different auxiliary pixel circuits PCa to one another.

According to an embodiment, as illustrated in FIG. 12, the second connection lines CL2 may be apart from each other in the second direction (for example, ±y direction). In other words, a substantially planar shape of each of the second connection lines CL2 may be an island shape. The 2-$1^{st}$ connection lines CL2-1 may be apart from each other in the second direction (for example, ±y direction), and the 2-$2^{nd}$ connection line CL2-2 may be apart from each other in the second direction (for example, ±y direction). In other words, a substantially planar shape of each of the 2-$1^{st}$ connection lines CL2-1 and the 2-$2^{nd}$ connection lines CL2-2 may be an island shape.

In FIG. 12, the second connection lines CL2 that are apart from each other in the second direction (for example, ±y direction) are illustrated, but in an embodiment, the second connection lines CL2 may continuously extend in the second direction (for example, ±y direction) in the component area CA. This will be described later in FIGS. 16 and 17.

According to an embodiment, the 2-$1^{st}$ connection line CL2-1 and the main data line DLm may be electrically connected to each other via the second contact plug CP2, and the 2-$1^{st}$ connection line CL2-1 and the auxiliary data line DLa may be electrically connected to each other via the second contact plug CP2. The 2-$2^{nd}$ connection line CL2-2 and the main driving voltage line PLm may be electrically connected to each other via the second contact plug CP2, and the 2-$2^{nd}$ connection line CL2-2 and the auxiliary driving voltage line PLa may be electrically connected to each other via the second contact plug CP2.

As illustrated in FIG. 13, second contact holes CNT2 may be formed in the first planarization layer 119$a$ and the second planarization layer 119$b$. Portions of the second connection line CL2 may be respectively buried in the second contact holes CNT2. The portions of the second connection lines CL2 respectively buried in the second contact holes CNT2 may be referred to as the second contact plugs CP2. The second connection line CL2 and the second contact plugs CP2 may be a single body.

Figure 14:
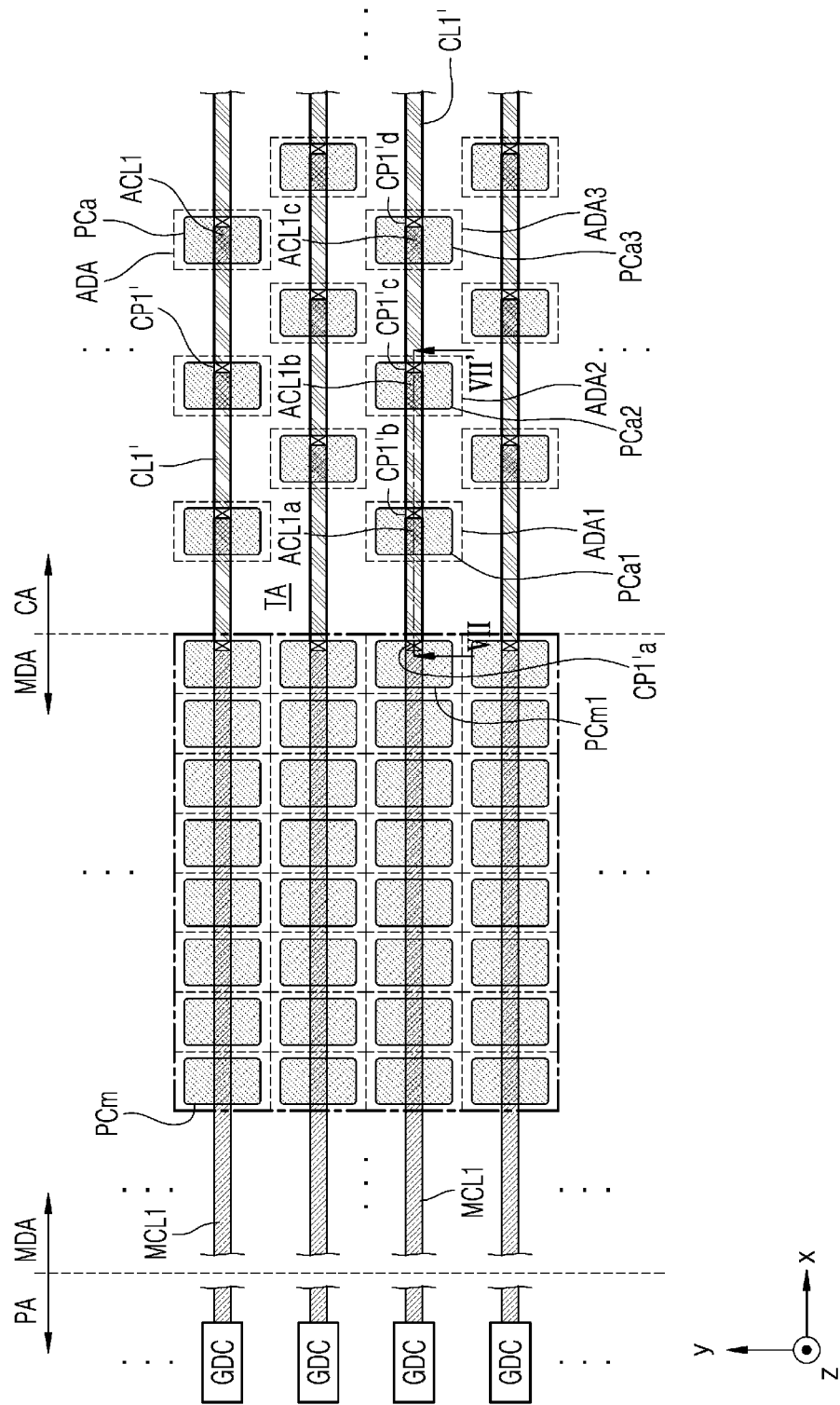
FIG. 14 is a schematic enlarged plan view of a portion of a display apparatus according to an embodiment.
Figure 15:
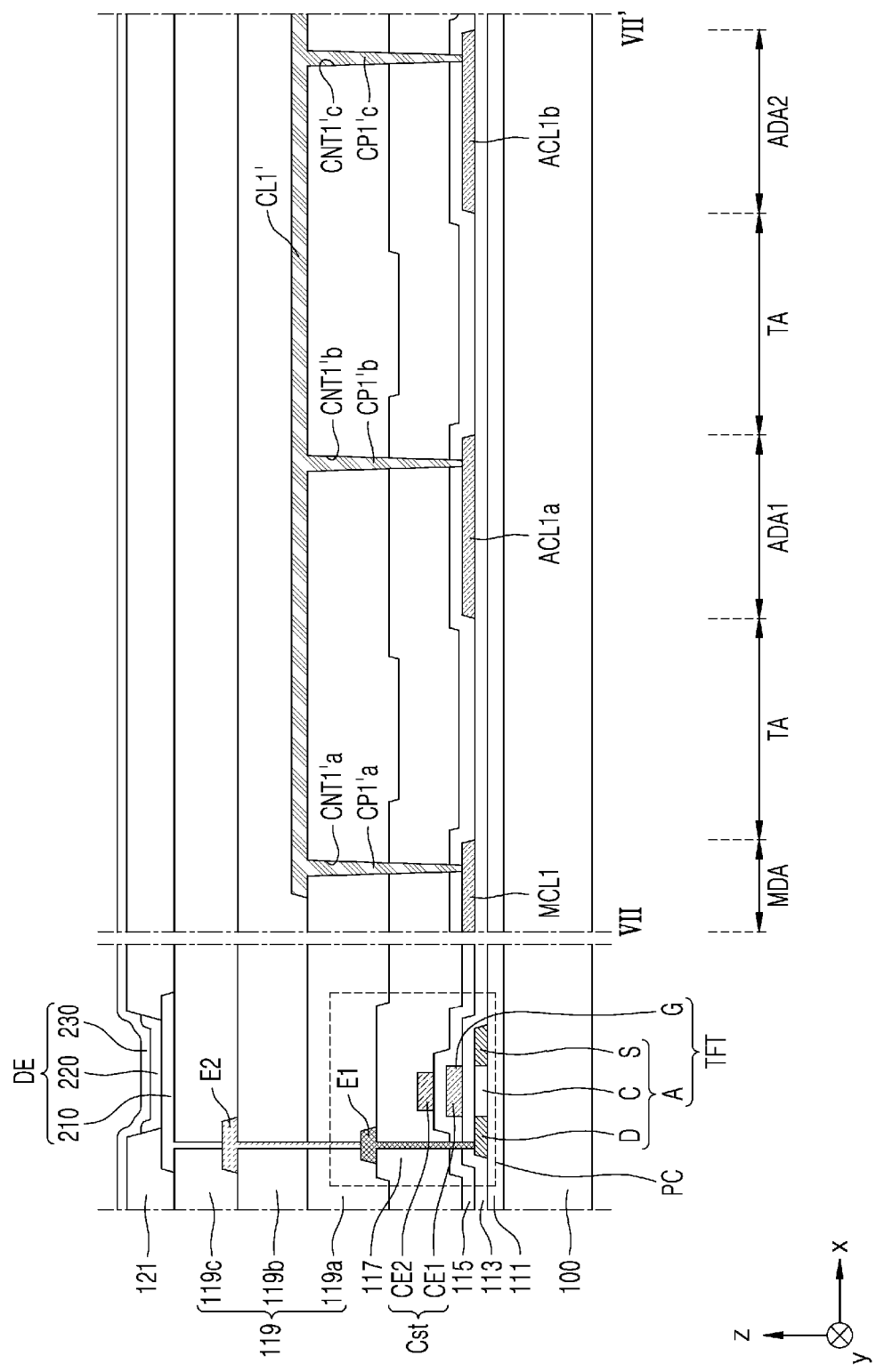
FIG. 15 is a schematic cross-sectional view of a portion of FIG. 14 taken along line VII-VII'.

FIG. 14 is a schematic enlarged plan view of a region of a display apparatus according to an embodiment. FIG. 15 is a schematic cross-sectional view of a portion of FIG. 14 taken along line VII-VII'. FIGS. 14 and 15 are respectively a modified embodiment of FIGS. 4 and 5, and may be different from embodiment of FIGS. 4 and 5 in a structure of a first connection line. Hereinafter, repeated details may be referred to the description provided with reference to FIGS. 4 and 5, and description will focus on the difference.

Referring to FIGS. 14 and 15, unlike the first connection line CL1 illustrated in FIGS. 4 and 5, a first connection line CL1' may extend and be arranged or disposed in the first direction (for example, ±x direction) in the component area CA.

A portion of the first connection line CL1' may overlap the transmission area TA, and another portion of the first connection line CL1' may overlap the auxiliary display area ADA. In other words, a portion of the first connection line CL1' may overlap the transmission area TA, and another portion of the first connection line CL1' may overlap the auxiliary pixel circuit PCa. A portion of the first connection line CL1' may overlap the transmission area TA, and another portion of the first connection line CL1' may overlap the first auxiliary conductive line ACL1.

As the first connection line CL1' may extend in the first direction (for example, ±x direction) in the component area CA, the first connection line CL1' may electrically connect the first main conductive line MCL1 to the first auxiliary conductive lines ACL1 arranged or disposed in the first direction (for example, ±x direction).

For example, as illustrated in FIG. 14, the first connection line CL1' may electrically connect the first main conductive line MCL1, the 1-$1^{st}$ auxiliary conductive line ACL1$a$, the 1-$2^{nd}$ auxiliary conductive line ACL1$b$, and the 1-$3^{rd}$ auxiliary conductive line ACL1$c$ to one another.

According to an embodiment, the first connection line CL1' and the first main conductive line MCL1 may be electrically connected to each other via a first contact plug CP1'. The first connection line CL1' and the first auxiliary conductive line ACL1 may be electrically connected to each other via the first contact plug CP1'.

For example, as illustrated in FIG. 14, the first connection line CL1' and the first main conductive line MCL1 may be electrically connected to each other via a 1-$1^{st}$ contact plug CP1'$a$, and the first connection line CL1' and the 1-$1^{st}$ auxiliary conductive line ACL1$a$ may be electrically connected to each other via a 1-$2^{nd}$ contact plug CP1'$b$, and the first connection line CL1' and the 1-$2^{nd}$ auxiliary conductive line ACL1$b$ may be electrically connected to each other via a 1-$3^{th}$ contact plug CP1'$c$, and the first connection line CL1' and the 1-$3^{th}$ auxiliary conductive line ACL1$c$ may be electrically connected to each other via a 1-$4^{th}$ contact plug CP1'$d$.

As such, in case that the first connection line CL1' extends in the component area CA in the first direction (for example, ±x direction), at least one first contact plug CP1' needs to be arranged or disposed per first main conductive line MCL1 or first auxiliary conductive line ACL1, and thus, the number of first contact plugs CP1' may be less than the number of the first contact plugs CP1' illustrated in FIG. 4.

Portions of the first connection line CL1' may be respectively buried in first contact holes formed in an insulating layer. The portions of the first connection lines CL1 respectively buried in the first contact holes may be respectively referred to as the first contact plugs CP1'. For example, the first connection line CL1' and the first contact plugs CP1' may be a single body.

For example, as illustrated in FIG. 15, a 1-$1^{st}$ contact hole CNT1'$a$, a 1-$2^{nd}$ contact hole CNT1'$b$, and a 1-$3^{rd}$ contact hole CNT1'$c$ may be formed in the second gate insulating layer 115, the interlayer insulating layer 117, and the first planarization layer 119$a$. Portions of the first connection line CL1' may be respectively buried in the 1-$1^{St}$ contact hole CNT1'$a$, the 1-$2^{nd}$ contact hole CNT1'$b$, and the 1-$3^{rd}$ contact hole CNT1'$c$. A portion of the first connection line CL1' buried in the 1-$1^{st}$ contact hole CNT1'$a$ may be referred to as the 1-$1^{st}$ contact plug CP1'$a$, a portion of the first connection line CL1' buried in the 1-$2^{nd}$ contact hole CNT1'$b$ may be referred to as the 1-$2^{nd}$ contact plug CP1'$b$, and a portion of the first connection line CL1' buried in the 1-$3^{rd}$ contact hole CNT1'$c$ may be referred to as a 1-$3^{rd}$ contact plug CP1'$c$. The first connection line CL1', the 1-$1^{st}$ contact plug CP1'$a$, the 1-$2^{nd}$ contact plug CP1'$b$, and the 1-$3^{rd}$ contact plug CP1'$c$ may be integrated.

Figure 16:
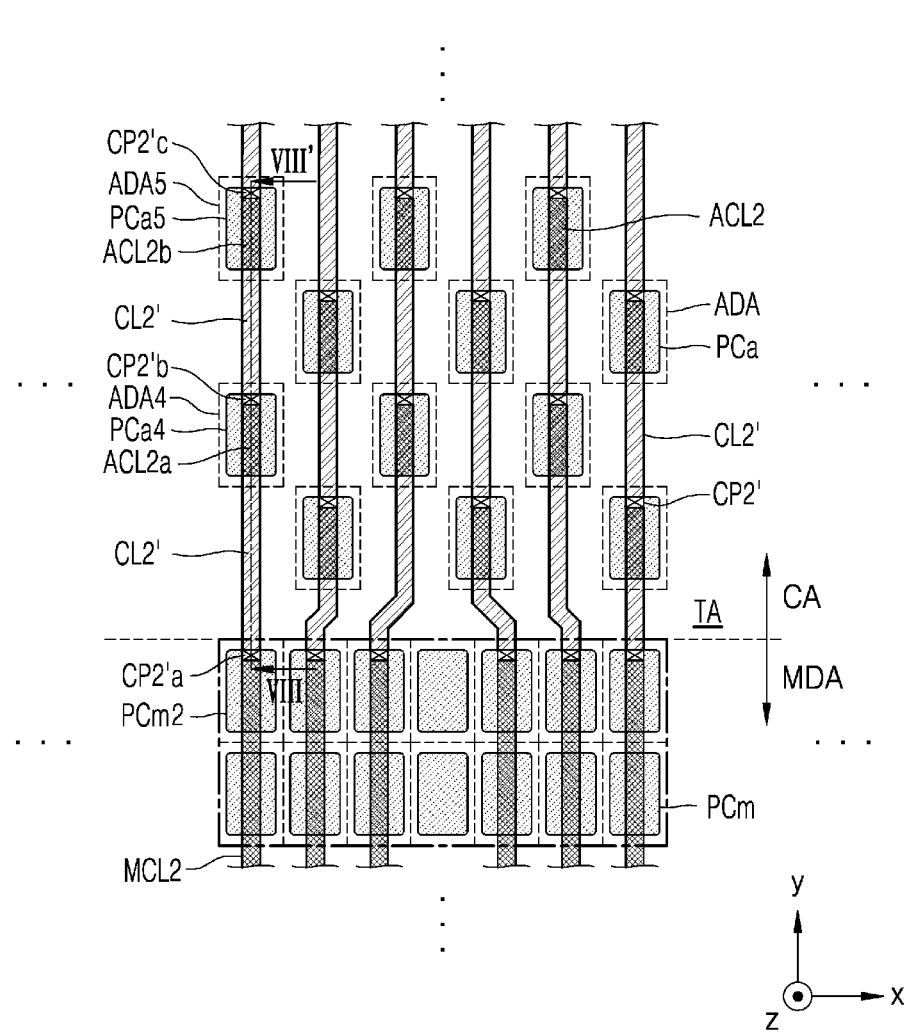
FIG. 16 is a schematic enlarged plan view of a portion of a display apparatus according to an embodiment.
Figure 17:
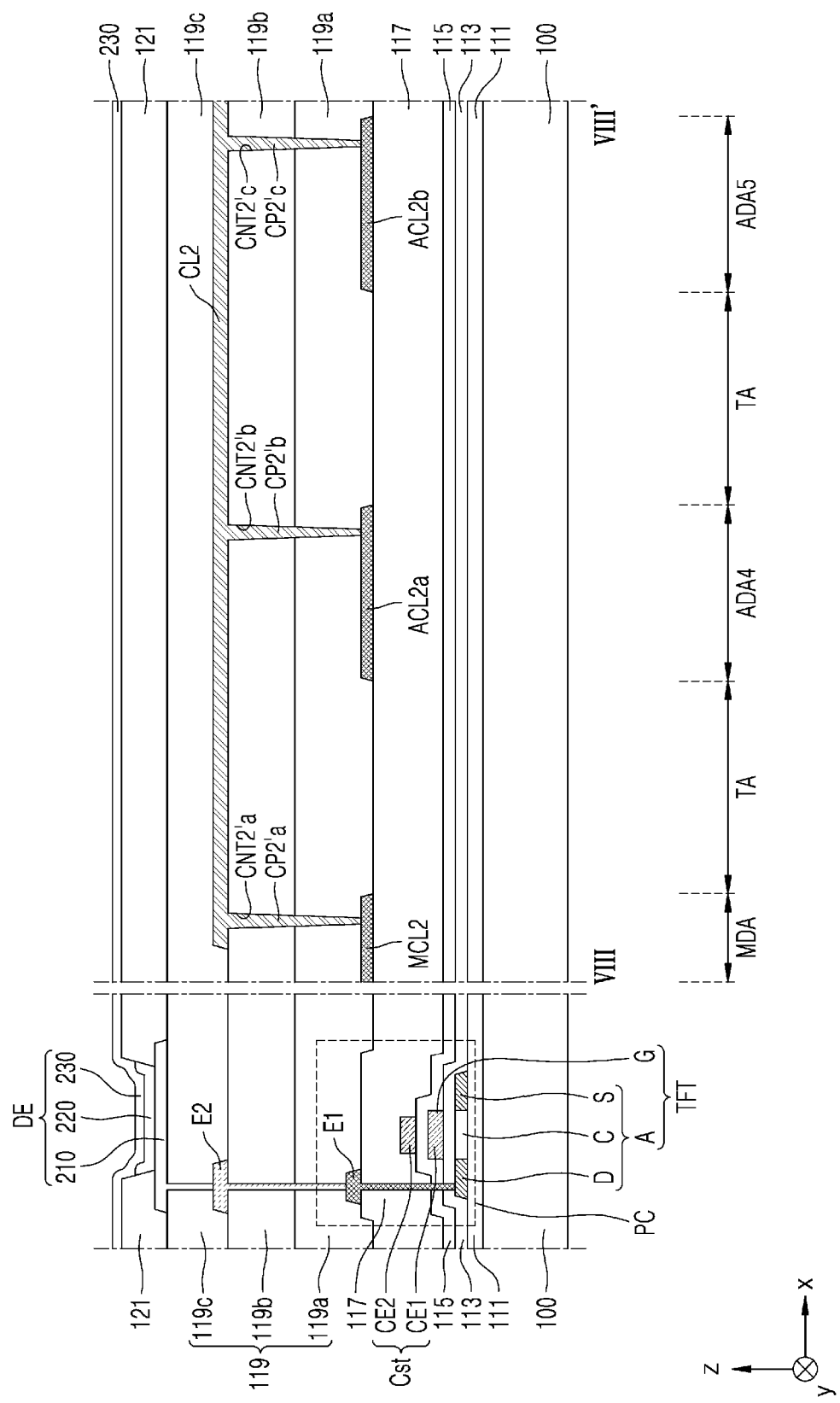
FIG. 17 is a schematic cross-sectional view of a portion of FIG. 16 taken along line VIII-VIII'.

FIG. 16 is a schematic enlarged plan view of a region of a display apparatus according to an embodiment. FIG. 17 is a schematic cross-sectional view of a portion of FIG. 16 taken along line VIII-VIII'. FIGS. 16 and 17 are respectively a modified embodiment of FIGS. 7 and 8, and may be different from embodiment of FIGS. 7 and 8 in a structure of a second connection line. Hereinafter, repeated details may be referred to the description provided with reference to FIGS. 7 and 8, and description will focus on the difference.

Referring to FIGS. 16 and 17, unlike the second connection line CL2 illustrated in FIGS. 7 and 8, the second connection line CL2' may extend and be arranged or disposed in the component area CA in the second direction (for example, ±y direction).

A portion of the second connection line CL2' may overlap the transmission area TA, and another portion of the second connection line CL2' may overlap the auxiliary display area ADA. In other words, a portion of the second connection line CL2' may overlap the transmission area TA, and another portion of the second connection line CL2' may overlap the auxiliary pixel circuit PCa. A portion of the second connection line CL2' may overlap the transmission area TA, and another portion of the second connection line CL2' may overlap the second auxiliary conductive line ACL2.

As the second connection line CL2' may extend in the component area CA in the second direction (for example, ±y direction), the second connection line CL2' may electrically connect the second main conductive line MCL2 and the second auxiliary conductive lines ACL2 that are arranged or disposed in the second direction (for example, ±y direction).

For example, as illustrated in FIG. 16, the second connection line CL2' may electrically connect the second main conductive line MCL2, the 2-$1^{st}$ auxiliary conductive line ACL2$a$, and the 2-$2^{nd}$ auxiliary conductive line ACL2$b$ to one another.

According to an embodiment, the second connection line CL2' and the second main conductive line MCL2 may be electrically connected to each other via a second contact plug CP2'. The second connection line CL2' and the second auxiliary conductive line ACL2 may be electrically connected to each other via the second contact plug CP2'.

For example, as shown in FIG. 16, the second connection line CL2' and the second main conductive line MCL2 may be electrically connected to each other via a 2-$1^{st}$ contact plug CP2'$a$, and the second connection line CL2' and the 2-$1^{st}$ auxiliary conductive line ACL2$a$ may be electrically connected to each other via a 2-$2^{nd}$ contact plug CP2'$b$, and the second connection line CL2' and the 2-2$^{nd}$ auxiliary conductive line ACL2b may be electrically connected to each other via a 2-3$^{th}$ contact plug CP2'c.

As described above, in case that the second connection line CL2' extends in the component area CA in the second direction (for example, ±y direction), at least one second contact plug CP2' needs to be arranged or disposed per second main conductive line MCL2 or second auxiliary conductive line ACL2, and thus, the number of the second contact plugs CP2' may be less than the number of second contact plugs CP2 illustrated in FIG. 7.

Portions of the second connection line CL2' may be respectively buried in second contact holes formed in an insulating layer. The portions of the second connection lines CL2 respectively buried in the second contact holes may be respectively referred to as the second contact plugs CP2'. For example, the second connection line CL2' and the second contact plugs CP2' may be a single body.

For example, as illustrated in FIG. 17, 2-1$^{st}$ contact holes CNT2'a, 2-2$^{nd}$ contact holes CNT2'b, and 2-3$^{rd}$ contact holes CNT2'c may be formed in the first planarization layer 119a and the second planarization layer 119b. Portions of the second connection line CL2' may be respectively buried in the 2-1$^{st}$ contact hole CNT2'a, the 2-2$^{nd}$ contact hole CNT2'b, and the 2-3$^{rd}$ contact holes CNT2'c. A portion of the second connection line CL2' buried in the 2-1$^{st}$ contact hole CNT2'a may be referred to as the 2-1$^{st}$ contact plug CP2'a, and a portion of the second connection line CL2' buried in the 2-2$^{nd}$ contact hole CNT2'b may be referred to as the 2-2$^{nd}$ contact plug CP2'b, and a portion of the second connection line CL2' buried in the 2-3$^{rd}$ contact hole CNT2'c may be referred to as the 2-3$^{rd}$ contact plug CP2'c. The second connection line CL2', the 2-1st contact plug CP2'a, the 2-2nd contact plug CP2'b, and the 2-3rd contact plug CP2'c may be integrated.

Figure 18:
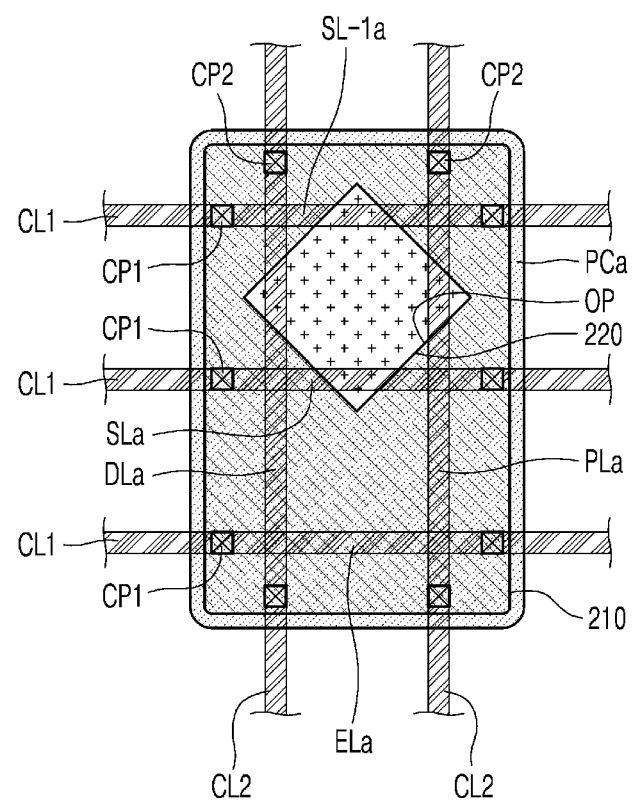
FIG. 18 is a schematic plan view of an auxiliary pixel circuit according to an embodiment.
Figure 19:
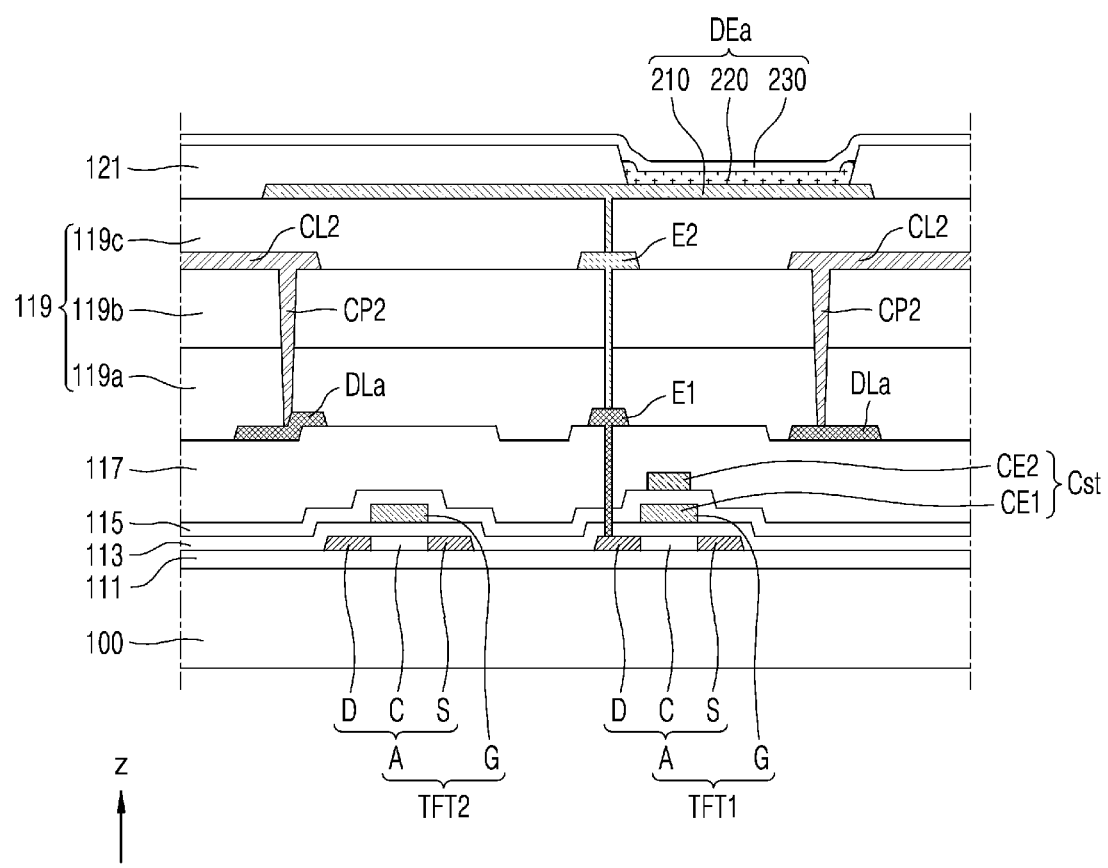
FIG. 19 is a schematic cross-sectional view of the auxiliary pixel circuit of FIG. 18.

FIG. 18 is a schematic plan view of an auxiliary pixel circuit according to an embodiment. FIG. 19 is a schematic cross-sectional view of the auxiliary pixel circuit of FIG. 18.

Referring to FIG. 18, as described above with reference to FIG. 11, the first auxiliary scan line SL-1a may be electrically connected to the first connection line CL1 via the first contact plug CP1. The second auxiliary scan line SLa may be electrically connected to the first connection line CL1 via the first contact plug CP1. The auxiliary emission control line ELa may be electrically connected to the first connection line CL1 via the first contact plug CP1.

Also, the auxiliary data line DLa may be electrically connected to the second connection line CL2 via the second contact plug CP2. The auxiliary driving voltage line PLa may be electrically connected to the second connection line CL2 via the second contact plug CP2.

The auxiliary display element DEa including the pixel electrode 210 and the intermediate layer 220 may be arranged or disposed on the auxiliary pixel circuit PCa. The intermediate layer 220 may be arranged or disposed in an opening OP formed in the pixel defining layer 121 to expose at least a portion of the pixel electrode 210.

According to an embodiment, the auxiliary display element DEa may overlap at least one of the first contact plug CP1 and the second contact plug CP2. In detail, the pixel electrode 210 of the auxiliary display element DEa may overlap at least one of the first contact plug CP1 and the second contact plug CP2. For example, as illustrated in FIG. 18, the pixel electrode 210 may overlap six first contact plugs CP1 and four second contact plugs CP2.

As described above, as the pixel electrode 210 covers or overlaps at least one of the first contact plug CP1 and the second contact plug CP2, a change in white angle dependence (WAD) according to a viewing angle may be reduced.

In FIG. 18, a substantially planar shape of the pixel electrode 210 is shown as substantially a square, but the substantially planar shape of the pixel electrode 210 may have various shapes such as substantially a circle, substantially an ellipse, substantially a polygon, substantially a star shape, or substantially a diamond shape.

Referring to FIG. 19, the auxiliary pixel circuit PCa may include a first transistor TFT1, a second transistor TFT2, and a storage capacitor Cst. The auxiliary display element DEa may overlap the first transistor TFT1, the second transistor TFT2, and the storage capacitor Cst. In detail, the pixel electrode 210 of the auxiliary display element DEa may overlap the first transistor TFT1, the second transistor TFT2, and the storage capacitor Cst. For example, as the pixel electrode 210 overlaps at least one of the first contact plug CP1 and the second contact plug CP2 arranged or disposed outside of the auxiliary pixel circuit PCa, the pixel electrode 210 may also overlap the first transistor TFT1, the second transistor TFT2, and the storage capacitor Cst in the auxiliary pixel circuit PCa.

While a display apparatus has been described above, the disclosure is not limited thereto. For example, a method of manufacturing the display apparatus is also included in the scope of the disclosure.

According to the various embodiments, a display apparatus having an extended display area to display an image also in an area in which a component, which is an electronic element, is arranged or disposed may be provided. However, the scope of the disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including:
      a component area including a first auxiliary display area and a transmission area surrounding the first auxiliary display area; and
      a main display area at least partially surrounding the component area;
   a first main pixel circuit disposed in the main display area;
   a first main conductive line disposed in the main display area, extending in a first direction, and electrically connected to the first main pixel circuit;
   a first auxiliary pixel circuit disposed in the first auxiliary display area;
   a first auxiliary conductive line disposed in the first auxiliary display area, extending in the first direction, and electrically connected to the first auxiliary pixel circuit; and
   a first connection line disposed in the component area, at least partially overlapping the transmission area, and electrically connecting the first main conductive line to the first auxiliary conductive line, wherein the first connection line has a higher light transmittance than a light transmittance of the first main conductive line and a light transmittance of the first auxiliary conductive line.

2. The display apparatus of claim 1, wherein the component area comprises:
a second auxiliary display area spaced apart from the first auxiliary display area and surrounded by the transmission area,
wherein the display apparatus comprises:
a second auxiliary pixel circuit disposed in the second auxiliary display area;
a second auxiliary conductive line disposed in the second auxiliary display area, extending in the first direction, and electrically connected to the second auxiliary pixel circuit; and
a second connection line disposed in the component area, at least partially overlapping the transmission area, and electrically connecting the first auxiliary conductive line to the second auxiliary conductive line.

3. The display apparatus of claim 2, wherein the first connection line and the second connection line are spaced apart from each other in the first direction.

4. The display apparatus of claim 2, further comprising:
a first contact plug of a plurality of first contact plugs, the first contact plug electrically connecting the first connection line to the first auxiliary conductive line;
a second contact plug of a plurality of second contact plugs, the second contact plug electrically connecting the second connection line to the first auxiliary conductive line; and
a first auxiliary display element disposed in the first auxiliary display area and electrically connected to the first auxiliary pixel circuit,
wherein the first auxiliary display element overlaps the first contact plug of the plurality of first contact plugs and the second contact plug of the plurality of second contact plugs.

5. The display apparatus of claim 4, wherein the first auxiliary display element comprises:
a pixel electrode;
an intermediate layer disposed on the pixel electrode; and
an opposite electrode disposed on the intermediate layer,
wherein the pixel electrode overlaps the first contact plug and the second contact plug.

6. The display apparatus of claim 4, wherein
the first connection line and the first contact plug are integral with each other, and
the second connection line and the second contact plug are integral with each other.

7. The display apparatus of claim 1, wherein
the component area comprises:
a second auxiliary display area spaced apart from the first auxiliary display area and surrounded by the transmission area,
the display apparatus further comprises:
a second auxiliary pixel circuit disposed in the second auxiliary display area; and
a second auxiliary conductive line disposed in the second auxiliary display area, extending in the first direction, and electrically connected to the second auxiliary pixel circuit,
the first auxiliary display area is disposed between the main display area and the second auxiliary display area, and the first connection line extends through the first auxiliary pixel circuit toward the second auxiliary pixel circuit and electrically connect the first main conductive line to the second auxiliary conductive line.

8. The display apparatus of claim 7, further comprising:
at least one first contact plug of a plurality of first contact plugs electrically connecting the first connection line to the first auxiliary conductive line; and
at least one second contact plug of a plurality of second contact plugs electrically connecting the first connection line to the second auxiliary conductive line.

9. The display apparatus of claim 1, further comprising:
a second main pixel circuit disposed in the main display area;
a second main conductive line disposed in the main display area, extending in a second direction, and electrically connected to the second main pixel circuit;
a second auxiliary conductive line disposed in the first auxiliary display area, extending in the second direction, and electrically connected to the first auxiliary pixel circuit; and
a third connection line disposed in the component area, at least partially overlapping the transmission area, and electrically connecting the second main conductive line to the second auxiliary conductive line.

10. The display apparatus of claim 9, further comprising:
a first conductive layer disposed on the substrate and comprising the first main conductive line and the first auxiliary conductive line;
a second conductive layer disposed on the first conductive layer and comprising the second main conductive line and the second auxiliary conductive line;
a third conductive layer disposed on the second conductive layer and comprising the first connection line; and
a fourth conductive line disposed on the third conductive layer and comprising the third connection line.

11. The display apparatus of claim 1, wherein the first connection line comprises a transparent conducting oxide.

12. The display apparatus of claim 1, wherein
the first connection line, the first main conductive line, and the first auxiliary conductive line are disposed on a same layer,
an end of the first connection line overlaps an end of the first main conductive line, and
another end of the first connection line overlaps an end of the first auxiliary conductive line.

13. The display apparatus of claim 1, further comprising:
a plurality of main pixel circuits comprising the first main pixel circuit and disposed in the main display area;
a plurality of main display elements disposed in the main display area and respectively electrically connected to the plurality of main pixel circuits;
a plurality of auxiliary pixel circuits comprising the first auxiliary pixel circuit and disposed in the component area; and
a plurality of auxiliary display elements disposed in the component area and respectively electrically connected to the plurality of auxiliary pixel circuits,
wherein a number of the plurality of main display elements per unit area is greater than a number of the plurality of auxiliary display elements per unit area.

14. The display apparatus of claim 1, further comprising a first auxiliary display element disposed in the first auxiliary display area and electrically connected to the first auxiliary pixel circuit, wherein the first auxiliary pixel circuit comprises:
- a first transistor controlling a current flowing to the first auxiliary display element, in response to a gate-source voltage;
- a second transistor that transfers a data voltage to the first transistor in response to a first scan signal; and
- a storage capacitor comprising a first electrode and a second electrode that is electrically connected to a gate of the first transistor, the first auxiliary display element overlaps the first transistor, the second transistor, and the storage capacitor.

15. A display apparatus comprising:
a substrate including:
- a first auxiliary display area;
- a second auxiliary display area; and
- a transmission area surrounding the first auxiliary display area and the second auxiliary display area;

a first auxiliary pixel circuit disposed in the first auxiliary display area;

a first auxiliary conductive line disposed in the first auxiliary display area, extending in a first direction, and electrically connected to the first auxiliary pixel circuit;

a second auxiliary pixel circuit disposed in the second auxiliary display area;

a second auxiliary conductive line disposed in the second auxiliary display area, extending in the first direction, and electrically connected to the second auxiliary pixel circuit; and a first connection line at least partially overlapping the transmission area and electrically connecting the first auxiliary conductive line to the second auxiliary conductive line, wherein the first connection line has a higher light transmittance than a light transmittance of the first auxiliary conductive line and a light transmittance of the second auxiliary conductive line.

16. The display apparatus of claim 15, wherein the substrate includes a third auxiliary display area surrounded by the transmission area,
- the second auxiliary display area is disposed between the first auxiliary display area and the third auxiliary display area, and wherein the display apparatus further comprises:
- a third auxiliary pixel circuit disposed in the third auxiliary display area;
- a third auxiliary conductive line disposed in the third auxiliary display area, extending in the first direction, and electrically connected to the third auxiliary pixel circuit; and
- a second connection line at least partially overlapping the transmission area and electrically connecting the second auxiliary conductive line to the third auxiliary conductive line.

17. The display apparatus of claim 16, further comprising:
- a first contact plug electrically connecting the first connection line to the second auxiliary conductive line;
- a second contact plug electrically connecting the second connection line to the second auxiliary conductive line; and
- a second auxiliary display element disposed in the second auxiliary display area and electrically connected to the second auxiliary pixel circuit, wherein the second auxiliary display element overlaps the first contact plug and the second contact plug.

18. The display apparatus of claim 15, wherein
the substrate further comprises: a third auxiliary display area surrounded by the transmission area, and
the display apparatus further comprises:
- a third auxiliary pixel circuit disposed in the third auxiliary display area; and
- a third auxiliary conductive line disposed in the third auxiliary display area, extending in the first direction, and electrically connected to the third auxiliary pixel circuit, the second auxiliary display area is disposed between the first auxiliary display area and the third auxiliary display area, the first connection line overlaps the first auxiliary pixel circuit, the second auxiliary pixel circuit, and the third auxiliary pixel circuit, and the first connection line extends in the first direction and electrically connects the second auxiliary conductive line to the third auxiliary conductive line.

* * * * *